US012667900B2

(12) United States Patent
Sasaki et al.

(10) Patent No.: US 12,667,900 B2
(45) Date of Patent: Jun. 30, 2026

(54) METHOD FOR MANUFACTURING CERAMIC CIRCUIT BOARD

(71) Applicants: KABUSHIKI KAISHA TOSHIBA, Tokyo (JP); TOSHIBA MATERIALS CO., LTD., Yokohama (JP)

(72) Inventors: Akito Sasaki, Yokohama (JP); Hiromasa Kato, Nagareyama (JP); Hideaki Hirabayashi, Yokohama (JP)

(73) Assignee: Niterra Materials Co., Ltd., Yokohama (JP)

( * ) Notice: Subject to any disclaimer, the term of this patent is extended or adjusted under 35 U.S.C. 154(b) by 92 days.

(21) Appl. No.: 18/451,346

(22) Filed: Aug. 17, 2023

(65) Prior Publication Data

US 2023/0390845 A1 Dec. 7, 2023

Related U.S. Application Data

(63) Continuation of application No. PCT/JP2022/014915, filed on Mar. 28, 2022.

(30) Foreign Application Priority Data

Mar. 30, 2021 (JP) ................................. 2021-057055

(51) Int. Cl.
*B23K 1/00* (2006.01)
*B23K 1/20* (2006.01)
(Continued)

(52) U.S. Cl.
CPC .............. *B23K 1/0016* (2013.01); *B23K 1/20* (2013.01); *C23F 1/18* (2013.01); *C23F 3/06* (2013.01);
(Continued)

(58) Field of Classification Search
CPC B23K 1/0016; B23K 35/302; B23K 2103/12; B23K 2103/52; B23K 1/20;
(Continued)

(56) References Cited

U.S. PATENT DOCUMENTS

2016/0192503 A1* 6/2016 Chiwata .................. H01L 23/12
29/847
2018/0005918 A1 1/2018 Naba et al.
(Continued)

FOREIGN PATENT DOCUMENTS

CN 101138354 A * 3/2008
CN 100508786 C * 7/2009
(Continued)

OTHER PUBLICATIONS

Extended European Search Report issued Mar. 10, 2025 in corresponding European Patent Application No. 22780718.7.

*Primary Examiner* — Kiley S Stoner
(74) *Attorney, Agent, or Firm* — Harness, Dickey & Pierce, P.L.C.

(57) ABSTRACT

According to the embodiment, in a method for manufacturing a ceramic circuit board in which a copper plate is bonded to at least one surface of a ceramic substrate via a brazing material layer, the brazing material layer does not include Ag, but includes Cu, Ti, and one or two of Sn or In, and a ceramic circuit board is prepared in which a portion of the brazing material layer is exposed between the patterned configuration of the copper plate. The method includes a chemical polishing process of chemically polishing the portion of the brazing material layer, and a brazing material etching process of etching the chemically polished portion of the brazing material layer by using an etchant that
(Continued)

1-1 — FIRST COPPER ETCHING PROCESS 4-1 — FIRST CLEANING PROCESS 2-1 — FIRST BRAZING MATERIAL ETCHING PROCESS 3-1 — FIRST CHEMICAL POLISHING PROCESS 5-1 — FINISHING CLEANING PROCESS includes one or two selected from hydrogen peroxide and ammonium peroxodisulfate and has a pH of not more than 6.

19 Claims, 7 Drawing Sheets

(51) Int. Cl.
| | |
|---|---|
| *C23F 1/18* | (2006.01) |
| *C23F 3/06* | (2006.01) |
| *H05K 3/06* | (2006.01) |
| *H05K 3/26* | (2006.01) |

(52) U.S. Cl.
CPC ................. *H05K 3/06* (2013.01); *H05K 3/26* (2013.01); *H05K 2203/0766* (2013.01)

(58) Field of Classification Search
CPC .... B23K 2101/36–42; C23F 1/18; C23F 3/06; C23F 1/02; C23F 1/44; H05K 3/06; H05K 3/26; H05K 2203/0766; H05K 1/0306; H05K 3/388; H05K 3/067
USPC ........................... 228/122.1–124.7, 245–262, 228/179.1–180.212, 262.6–262.61
See application file for complete search history.

(56) References Cited

U.S. PATENT DOCUMENTS

| | | | | | |
|---|---|---|---|---|---|
| 2020/0170118 | A1 | * | 5/2020 | Kato | .......................... C04B 41/88 |
| 2020/0384579 | A1 | * | 12/2020 | Britting | .............. B23K 35/0222 |
| 2024/0395679 | A1 | * | 11/2024 | Ozaki | ................. H10W 70/461 |

FOREIGN PATENT DOCUMENTS

| | | | | | |
|---|---|---|---|---|---|
| CN | 111403347 | A | * | 7/2020 | ............. B23K 1/008 |
| CN | 111627822 | A | * | 9/2020 | |
| CN | 108356926 | B | * | 1/2021 | ............... B27D 1/04 |
| CN | 113875840 | A | * | 1/2022 | ............... A23F 3/08 |
| CN | 217929141 | U | * | 11/2022 | |
| FR | 2693139 | A1 | * | 1/1994 | ............ B23K 1/008 |
| JP | H01-206508 | A | | 8/1989 | |
| JP | 2003-283064 | A | | 10/2003 | |
| JP | 2017152659 | A | * | 8/2017 | ................ C23F 1/28 |
| KR | 0162969 | B1 | * | 11/1998 | |
| KR | 20150133191 | A | * | 11/2015 | |
| TW | 1394504 | B | * | 4/2013 | ........... B23K 26/009 |
| WO | WO-2017/056360 | A1 | | 4/2017 | |
| WO | WO-2019008003 | A1 | * | 1/2019 | ........... B23K 1/0016 |
| WO | WO-2019054294 | A1 | * | 3/2019 | ............. C04B 41/88 |
| WO | WO-2019082970 | A1 | * | 5/2019 | ........... C04B 35/645 |
| WO | WO-2022001983 | A1 | * | 1/2022 | ............. B23K 35/24 |
| WO | WO-2022113985 | A1 | * | 6/2022 | ................ H05K 3/38 |

* cited by examiner 1-1 — FIRST COPPER ETCHING PROCESS 2-1 — FIRST BRAZING MATERIAL ETCHING PROCESS 3-1 — FIRST CHEMICAL POLISHING PROCESS 1-2 — SECOND COPPER ETCHING PROCESS 2-2 — SECOND BRAZING MATERIAL ETCHING PROCESS 3-2 — SECOND CHEMICAL POLISHING PROCESS

METHOD FOR MANUFACTURING CERAMIC CIRCUIT BOARD

CROSS-REFERENCE TO RELATED APPLICATIONS

This application is a continuation application of International Patent Application PCT/JP2022/014915, filed on Mar. 28, 2022. This application also claims priority to Japanese Patent Application No. 2021-057055, filed on Mar. 30, 2021. The entire contents of the above applications are incorporated herein by reference.

FIELD

The present application relates to embodiments related to a method for manufacturing a ceramic circuit board.

BACKGROUND

This section provides background information related to the present disclosure which is not necessarily prior art.

The outputs of power modules are being increased. Accordingly, guaranteed operating temperatures of semiconductor elements have become high and are 175° C. or more. It is therefore desirable to improve the thermal cycle test (TCT) characteristics also for ceramic circuit boards on which the semiconductor elements are mounted.

For example, the provision of an inclined structure in a copper plate side surface and the optimization of the jutting portion size of a bonding layer are described in WO 2017/056360 (Patent Literature 1). Excellent TCT characteristics are obtained in Patent Literature 1. According to Patent Literature 1, it is especially favorable to optimize the size of the jutting portion of the bonding layer.

Etching of a brazing material layer is performed to control the jutting portion size of the bonding layer. For example, WO 2019/054294 (Patent Literature 2) discusses an etching process of a brazing material layer. In Patent Literature 2, a chemical polishing process and an etching process are combined. The jutting portion size of the bonding layer can be controlled by such a method.

DRAWINGS

DETAILED DESCRIPTION

Figure 1:
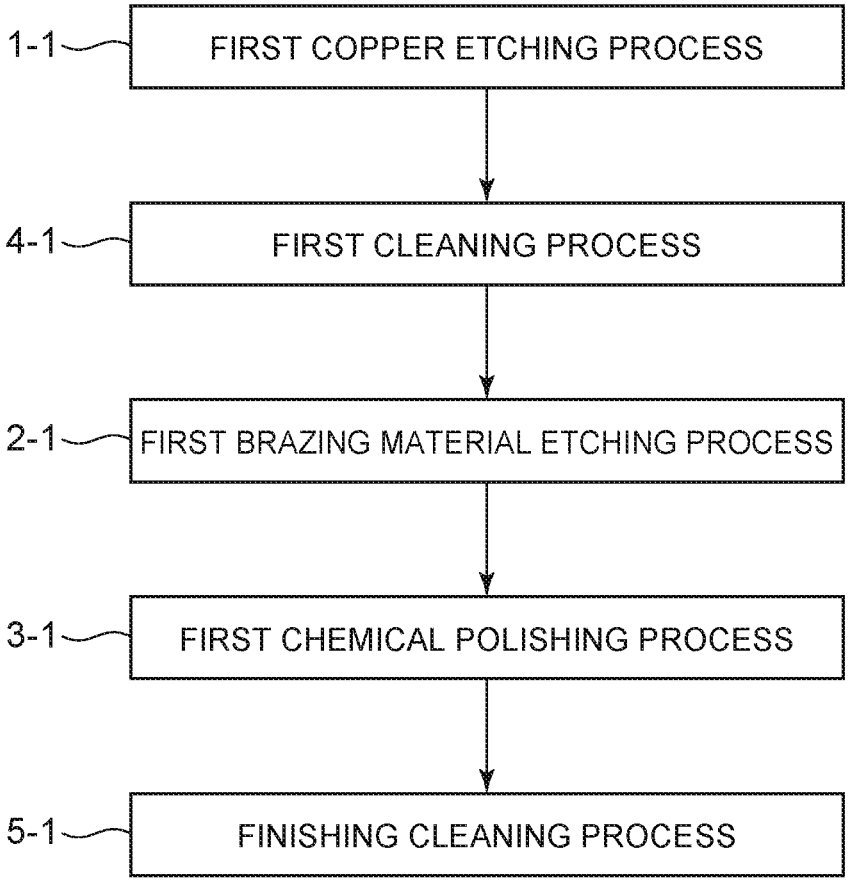
FIG. 1 is a process drawing illustrating a first embodiment.

A method for manufacturing a ceramic circuit board according to an embodiment includes a process of preparing a bonded body in which a copper member is bonded to at least one surface of a ceramic substrate via a brazing material layer that does not include Ag but includes Cu, an active metal, and a first element that is at least one selected from Sn and In, a first copper etching process of etching a portion of the copper member and a layer that is included in the brazing material layer and includes Cu and the first element as major components, a first brazing material etching process of etching an active metal reaction layer included in the brazing material layer by using an etchant that includes one or two selected from hydrogen peroxide and ammonium peroxodisulfate and has a pH of not less than 4 and not more than 12, and a first chemical polishing process of chemically polishing an end portion of the brazing material layer exposed by the first brazing material etching process.

The ceramic circuit board is a member in which the ceramic substrate and the copper plate are bonded via the brazing material layer.

A silicon nitride substrate, an aluminum nitride substrate, an aluminum oxide substrate, an Alusil substrate, etc., are examples of the ceramic substrate. For example, the plate thickness of the ceramic substrate is 0.2 to 0.8 mm. For example, the thermal conductivity of the silicon nitride substrate is not less than 80 W/m·K; and the three-point bending strength of the silicon nitride substrate is not less than 600 MPa. For example, the thermal conductivity of the aluminum nitride substrate is not less than 150 W/m·K; and the three-point bending strength of the aluminum nitride substrate is 300 to 550 MPa. For example, the thermal conductivity of the aluminum oxide substrate is 20 to 40 W/m·K; and the three-point bending strength of the aluminum oxide substrate is 400 to 500 MPa.

An Alusil substrate is a substrate that includes zirconium oxide and aluminum oxide. The thermal conductivity of an Alusil substrate is 20 to 40 W/m·K; and the three-point bending strength of an Alusil substrate is 450 to 600 MPa. Because the strength of a silicon nitride substrate is high, the substrate can be thinned to 0.33 mm or less. An aluminum nitride substrate has a high thermal conductivity. Also, although the thermal conductivities of an aluminum oxide substrate and an Alusil substrate are low, these substrates are inexpensive. The type of ceramic substrate can be selected as appropriate to match the purpose. Also, silicon nitride substrates and aluminum nitride substrates are called nitride ceramics. Aluminum oxide substrates, Alusil substrates, and zirconium oxide substrates are called oxide ceramics. Also, silicon nitride substrates and the like are Si-including ceramics. Aluminum oxide substrates, Alusil substrates, aluminum nitride substrates, and the like are Al-including ceramics.

It is favorable for the copper member to be made of oxygen-free copper. Oxygen-free copper is copper having a purity of not less than 99.96 wt %. When the oxygen inside the copper member is high, the bonding strength may decrease in the active metal bonding. The copper member may be a copper plate or may be a film of copper formed on a brazing material layer. Also, the copper member is made of a composite material of copper and carbon and may have a structure such that a layer of graphite exists inside copper. Hereinafter, the case will be described where the copper member is a copper plate.

It is favorable for the plate thickness of the copper plate to be not less than 0.2 mm. The heat dissipation of the copper plate can be improved by making the plate thickness thick, i.e., not less than 0.7 mm. Although not particularly limited, it is favorable for the upper limit of the plate thickness to be not more than 5 mm. When the plate thickness is greater than 5 mm, the warp of the bonded body may become large when the copper plate and the ceramic substrate are bonded. Also, the patterning of the copper plate into the patterned configuration by etching becomes difficult. Copper plates may be bonded respectively to two surfaces of the ceramic substrate, or may be bonded to only one surface of the ceramic substrate. More favorably, the copper plates are bonded to the two surfaces of the ceramic substrate. When the copper plates are bonded to the two surfaces, the thicknesses of the copper plates may be equal to each other or different from each other. Considering the suitability for mass production, it is favorable for the thicknesses of the copper plates to be equal. When a patterned configuration (a circuit configuration) is provided in the copper plate, the number of patterned configurations provided is not particularly limited. A patterned configuration may be provided in one location of the copper plate, or patterned configurations may be provided in multiple locations of the copper plate.

The brazing material layer includes Cu, Ti, and a first element but does not include silver (Ag). The first element is at least one selected from Sn and In. Here, a brazing material that does not include Ag also is called a Ag-less brazing material. "Not including silver" refers to the silver content being not more than 0.01 wt %. Being not more than 0.01 wt % means that unavoidable impurities may be included. Also, active metal bonding is used to bond the ceramic substrate and the copper plate. In the active metal bonding, a brazing material that includes Ti (titanium) as the active metal is used. A general active metal brazing material includes Ag (silver), Cu (copper), and Ti (titanium). Ag and Cu are components that form eutectic solids with each other. The bondability is improved by forming a AgCu eutectic solid. For a brazing material layer that includes Ag, silver chloride (AgCl) is formed when a chloride such as iron chloride, copper chloride, or the like is used in the etching of the copper plate. Such silver chloride had extremely low solubility and poor etchability. Therefore, the chemical liquid that etched the brazing material layer including Ag was easily degraded. It is necessary to replace the chemical liquid when the chemical liquid degrades. A higher chemical liquid replacement frequency causes a cost increase. The durability of the chemical liquid can be improved by using a brazing material layer that does not include Ag. Also, when comparing a brazing material layer not including Ag and a brazing material layer including Ag, when etching the same amount, the brazing material layer that does not include Ag can have a shorter etching time. Also, the number of times etching is performed can be reduced. In this respect as well, the durability of the chemical liquid can be improved. Also, in Patent Literature 2, a chemical polishing process was necessary before the etching process of the brazing material layer to remove silver chloride.

Cu (copper) and Ti (titanium) are essential components of the brazing material layer. Cu is a component forming the base material of the brazing material layer. Also, Ti is an active metal, and is a component that forms a Ti reaction layer by reacting with the ceramic substrate. The bonding strength between the ceramic substrate and the copper plate can be increased by the existence of the Ti reaction layer. In an oxide ceramic substrate, titanium oxide ($TiO_2$) is the major part of the Ti reaction layer. Also, in a nitride ceramic substrate, titanium nitride (TiN) is the major part of the Ti reaction layer. An alumina substrate, a zirconium substrate, an Alusil substrate, etc., are examples of the oxide ceramic substrate. Also, an aluminum nitride substrate, a silicon nitride substrate, etc., are examples of the nitride ceramic. Copper and the like of the brazing material component may be included in the TiN layers of these substrates. Here, a titanium nitride (TiN) layer is called an active metal reaction layer. Also, an active metal reaction layer also is called an active metal brazing material layer. Although other active metals such as Zr, Hf, Nb, etc., may be added as active metals, it is favorable for the amount of the active metal used in such a case to be not more than 25 mass % in total with Ti. Locations that include copper, tin, or indium also exist in the active metal brazing material layer.

Also, the brazing material layer includes one or two of Sn (tin) or In (indium). Sn or In has the effect of lowering the melting point of the brazing material. The brazing material may include C (carbon). Carbon can improve the fluidity of the brazing material. It is desirable for the fluidity of the brazing material to be good to coat the brazing material onto a large ceramic substrate.

It is favorable for the Cu content of the brazing material to be not less than 20 mass % and not more than 90 mass % when the entire powder raw material is used as 100 mass %. Also, it is favorable for the Ti content alone or in compound to be not less than 0.5 mass % and not more than 25 mass %. Ti alone or in compound is added as Ti or titanium hydride ($TiH_2$). Also, it is favorable for the Sn or In content to be not less than 5 mass % and not more than mass % in total. It is favorable for the C content to be not less than 0 mass % and not more than 5 mass %. For example, when the brazing material is made of Cu, Ti, and Sn, Cu+Ti+Sn=100 mass %. Also, when the brazing material is made of Cu, $TiH_2$, Sn, and C Cu+$TiH_2$+Sn+C=100 mass %.

The bonded body of the ceramic substrate and the copper plate is manufactured using the brazing material. Bonding methods that use the brazing material include a method in which a brazing material component is mixed with a solvent and coated in paste form, a method in which an alloy foil or the like is patterned into a prescribed shape and bonded, etc. The bonding method that uses a paste is favorable because the time-consuming patterning into the prescribed shape can be reduced. Here, the brazing material that is dissolved in a solvent (including organic compounds) is called a brazing material paste. The brazing material paste is coated onto the ceramic substrate; and the copper plate is disposed on the brazing material paste. Subsequently, a thermal bonding process is performed. It is favorable for the coating thickness of the brazing material paste to be within the range of not less than 10 μm and not more than 100 μm. It is more favorable for the coating thickness of the brazing material paste to be within the range of not less than 10 μm and not more than 60 μm. Also, it is favorable for the temperature of the thermal bonding process to be within the range of not less than 650° C. and not more than 900° C. It is favorable for the atmosphere of the bonding process to be a vacuum (not more than $10^{-3}$ Pa) or an inert atmosphere. Inert atmosphere refers to an atmosphere having a low oxygen concentration. It is favorable for the partial pressure of oxygen to be not more than 5% in the inert atmosphere. A nitrogen atmosphere, a noble gas atmosphere of argon, neon, helium, xenon, or the like, etc., are examples of inert atmospheres. Making a vacuum or inert atmosphere may be performed before heating. The brazing material paste becomes the brazing material layer after the thermal bonding process.

The length of the long side of the ceramic substrate may be not less than 100 mm. Also, the length of the long side of the ceramic substrate may be not less than 200 mm. Multipart manufacturing is made possible by increasing the long side of the ceramic substrate. Multi-part manufacturing is a method of manufacturing multiple ceramic circuit boards by subdividing a large ceramic circuit board. Thus, when multipart manufacturing is performed, it is favorable to form a scribe trench in the ceramic substrate. The timing of the formation of the scribe trench is not particularly limited. The timing of the formation may be before copper member bonding or may be any timing after bonding. Also, when the scribe trench is formed before the bonding with the copper member, it is more favorable to form the scribe trench in a sintered ceramic substrate. The shape of the scribe trench may be a dot configuration, a linear shape, a combination of these shapes, or other shapes. Also, the scribe trench may or may not extend through at some locations. The shape of the scribe trench is not particularly limited. Also, a break (subdivision) process may be provided separately from the formation of the scribe trench. Furthermore, notches, through-holes, etc., may be formed as necessary in the bonded body. Thus, the specific shape of the bonded body is arbitrary and is not particularly limited. As described below, a bonded body in which a copper plate is bonded to a large ceramic substrate is prepared. A large bonded body can be prepared by using a large ceramic substrate. The ceramic circuit board is subdivided by scribing after the desired patterned configuration is provided by patterning the copper plate by etching. The suitability for mass production can be improved by subdividing a large bonded body. Although not particularly limited, it is favorable for the upper limit of the length of the long side of the ceramic substrate to be not more than 500 mm. When the length of the long side of the ceramic substrate is greater than 500 mm, the ceramic substrate may be too heavy, and the burden of the transportation operation may increase. Although not particularly limited, it is favorable for the length of the short side of the ceramic substrate to be not less than 50 mm. Also, the lengths of the sides of the ceramic substrate may be equal. According to the method for manufacturing the ceramic circuit board according to the embodiment, the etchability is good even when the ceramic substrate is large. The method for manufacturing the ceramic circuit board according to the embodiment also is applicable to a ceramic substrate having a long side of less than 100 mm or a short side of less than 50 mm.

It is favorable for the size difference between the ceramic substrate and copper plate of the bonded body to be within ±2 mm in the longitudinal direction and the lateral direction. It is favorable for the longitudinal and lateral sizes of the ceramic substrate and the copper plate to be substantially the same. Also, in the bonded body, it is favorable for the copper plates to be bonded to two surfaces of the ceramic substrate. By bonding the copper plates to the two surfaces, both copper plates of the surface and the back side can be provided with patterned configurations.

Also, at the same surface of the ceramic substrate of the bonded body, there may be locations at which the distance between the copper plate patterns is not more than 2 mm. The distance between the copper plate patterns refers to the shortest distance between adjacent copper plates after the circuit pattern is provided by etching. When the copper plate side surface has an inclined shape, the shortest distance between the inclined shapes is the distance between the copper plate patterns.

According to the method for manufacturing the ceramic circuit board according to the embodiment, the manufacturing can be performed with a high yield even for a fine pattern, i.e., when the distance between the copper plate patterns is not more than 2 mm. That is, the yield is good even for a ceramic circuit board that is a large substrate having a long side length of not less than 100 mm and a distance between copper plate patterns of not more than 2 mm. Also, the distance between copper plate patterns being not more than 2 mm means that the most narrow distance between patterns is not more than 2 mm. That is, there may be locations at which the distance between patterns is greater than 2 mm as long as there is a location at which the most narrow distance between patterns is not more than 2 mm.

FIG. 1 shows an example of the manufacturing process of the ceramic circuit board according to the embodiment.

The manufacturing method according to the embodiment includes a process of preparing a ceramic copper bonded body to which a copper plate is bonded, a first copper etching process, a first brazing material etching process, a first chemical polishing process, and a finishing cleaning process. In the first copper etching process, the copper plate and a layer including at least one of copper-tin or copper-indium as a major component are etched. In the first brazing material etching process, an active metal reaction layer which is a portion of a brazing material layer is etched with an etchant that includes one or two selected from hydrogen peroxide and ammonium peroxodisulfate and has a pH of not less than 4 and not more than 12. In the first chemical polishing process, the end portion of the brazing material layer exposed by the first brazing material etching process is chemically polished. In the finishing cleaning process, the processed bonded body (ceramic circuit board) is cleaned.

In the first copper etching process, the copper plate of the ceramic copper bonded body and the layer of the brazing material layer including copper-tin or copper-indium as a major component are etched. A patterned configuration is provided in the copper plate by the etching of the copper plate. In other words, after the etching, the copper plate that corresponds to the pattern remains, and the copper between the patterns is removed. Also, the active metal reaction layer is exposed between the patterned configuration of the copper plate because the layer including copper-tin or copper-indium as a major component is etched. The layer including copper-tin or copper-indium as a major component refers to a region in which one or two of copper-tin or copper-indium are included at not less than 40%. Hereinafter, the layer including copper-tin or copper-indium as a major component is called a "copper alloy layer". The active metal reaction layer is a portion of the brazing material layer. A bonded body in which the active metal reaction layer is exposed by the first copper etching process is prepared.

In the copper etching process, an etching resist is coated onto the locations that will remain as the pattern. The copper etching process mainly uses an aqueous solution of iron chloride or copper chloride. Iron chloride or copper chloride is effective for etching a copper plate, copper layer, copper-tin layer, copper-indium layer, etc. On the other hand, iron chloride or copper chloride cannot etch an active metal reaction layer that includes an active metal. Therefore, according to the first copper etching process, there can be locations at which the active metal reaction layer is exposed. Because the brazing material layer does not include Ag, it is possible to etch both the copper plate and the copper alloy layer with one etching process.

A cleaning process may be performed after the copper etching process as necessary. In the etching of the copper plate and the copper alloy layer, iron(III) chloride ($FeCl_3$) may be used as iron chloride; and copper(I) chloride (CuCl) may be used as copper chloride.

Although not particularly limited, it is favorable for the concentration of the aqueous solution of iron chloride or copper chloride to be not less than 0.2 wt %. The etching is efficiently performed thereby. Also, it is favorable for the concentration of the aqueous solution to be not more than 50 wt %. When the concentration is high, i.e., greater than 50 wt %, there is a possibility that the etching rate cannot be adjusted and causes over-etching. Even when copper chloride and iron chloride are mixed, it is favorable for their total concentration in the aqueous solution to be within the range described above. A more desirable range of the concentration of the aqueous solution including iron chloride or copper chloride is not less than 5 wt % and not more than 40 wt %.

The etching process of the copper plate and the copper alloy layer may be performed only once, or may be performed by dividing into two or more steps. Also, a small amount of the copper alloy layer may remain between the copper plate patterns after the first copper etching process.

In the following brazing material etching process, the active metal reaction layer which is a portion of the brazing material layer is etched with an etchant including one or two selected from hydrogen peroxide and ammonium peroxodisulfate.

It is favorable for the brazing material etchant used in the brazing material etching process to have a pH of not less than 4. When the pH is less than 4, the rate at which the brazing material layer is etched may be too fast. To improve the TCT characteristics of the ceramic circuit board, it is effective to leave a brazing material jutting portion (a bonding layer jutting portion). The brazing material jutting portion refers to a portion jutting in an in-plane direction from the copper plate between the copper plate patterns when viewed in plan. Viewed in plan means viewed along a direction perpendicular to the ceramic substrate surface. The in-plane direction is a direction parallel to the ceramic substrate surface. When the etching rate of the brazing material layer is too fast, the size control of the brazing material jutting portion becomes difficult.

Also, it is favorable for the brazing material etchant to have a pH of not more than 12. When the pH is large, i.e., greater than 12, the basicity may be too strong and the adjustment of the etching rate may become difficult. The relationship between the liquid property and the pH of a solution will now be described. An aqueous solution having a pH of less than 7 is an acidic aqueous solution. An aqueous solution having a pH of 7 is a neutral aqueous solution. An aqueous solution having a large pH greater than 7 is a basic (alkaline) aqueous solution. The liquid properties (whether acidic, neutral, or basic) of hydrogen peroxide and ammonium peroxodisulfate will now be considered. An aqueous hydrogen peroxide solution is an acidic aqueous solution. An ammonium peroxodisulfate aqueous solution also is an acidic aqueous solution. Accordingly, to make the liquid property of an aqueous solution including one or two selected from hydrogen peroxide and ammonium peroxodisulfate neutral or basic, it is necessary to mix a basic aqueous solution; and the necessary solute amount may increase and the cost may increase. For example, a method of adjusting the pH by mixing sodium hydroxide or the like is an example of a method of mixing a basic solution to make the liquid property of the etchant basic. To adjust to a basic aqueous solution having a pH of 12 or less, it becomes necessary to add other components. Considering the cost, it is favorable for the liquid property to be acidic (a pH of less than 7).

When the brazing material etchant is acidic (having a pH of less than 7), the rate at which the brazing material layer is etched is slow when the pH is large, i.e., greater than 6. Accordingly, it is more favorable for the pH of the brazing material etchant to be not less than 4.0 and not more than 6.0.

More favorably, the pH of the brazing material etchant is not less than 4.0 and not more than 5.8. The control of the brazing material jutting portion and the control of the etching rate both can be performed in this range.

It is more favorable to mix a fluorine-including compound in an etchant including one or two selected from hydrogen peroxide and ammonium peroxodisulfate and having a pH of not less than 4. Fluoroboric acid, ammonium fluoride, hydrogen fluoride, hexafluorophosphoric acid, trifluoroacetic acid (TFA), etc., are examples of the fluorine-including compound. It is favorable for the fluorine-including compound to be a fluoride. Among fluorides, it is more favorable to include at least one selected from fluoroboric acid, ammonium fluoride, and hydrogen fluoride. Also, none of the fluorides described above are strong bases. Therefore, unfavorable effects on the pH control are less likely. At least one may refer to only one, or may be a mixture of two or three.

Furthermore, it is more favorable for an etchant that includes one or two selected from hydrogen peroxide and ammonium peroxodisulfate and has a pH of not less than 4 to include a pH-stabilizing agent.

It is more favorable for an etchant that includes one or two selected from hydrogen peroxide and ammonium peroxodisulfate and has a pH of not less than 4 to include hydrogen peroxide, and to include ammonium fluoride as a fluorine-including compound. It is more favorable for an aqueous solution that includes hydrogen peroxide and ammonium fluoride to include a pH-stabilizing agent.

Hydrogen peroxide ($H_2O_2$) or ammonium peroxodisulfate (($NH_4$)$_2S_2O_8$) is effective in removing Cu. These components can remove Cu by ionization. The ionization effect is increased by making the liquid property acidic (particularly a pH of not more than 6). Also, hydrogen peroxide or ammonium peroxodisulfate is effective as an oxidizing agent that oxidizes active metals, Sn, In, and carbon. For example, when the brazing material includes Ti, TiN (titanium nitride) is formed on the nitride ceramic substrate. The etching components described above have the effect of changing Ti or TiN into $TiO_2$. Similarly, the components have the effect of changing the Sn or Sn nitride in the brazing material into $SnO_2$. This is similar for In and the like as well.

Therefore, an etchant that includes hydrogen peroxide or ammonium peroxodisulfate is effective in removing the active metal reaction layer. Also, even when a small amount of the copper alloy layer remains in the etching process of the copper member and the copper alloy layer, an etchant that includes hydrogen peroxide or ammonium peroxodisulfate can remove the remaining copper alloy layer.

It is favorable for the hydrogen peroxide to have the quality indicated in JIS-K-1463 (2007). ISO 6352-2 is referenced by JIS-K-1463. Also, it is favorable for the ammonium peroxodisulfate to have the quality indicated in JIS-K-8252 (2010).

Ammonium fluoride ($NH_4F$) functions as an etchant of oxides. Ammonium fluoride can change an active metal oxide from an oxide into a compound including fluorine atoms, or ions thereof. For example, $TiO_2$ can be removed by changing to $TiOF_2$, $TiF_6^{2-}$, etc. Also, ammonium fluoride includes ammonium hydrogen fluoride (($NH_4$)$HF_2$) as well. Also, oxides such as $TiO_2$ and the like are formed by oxidizing agents such as hydrogen peroxide ($H_2O_2$) or ammonium peroxodisulfate (($NH_4$)$_2S_2O_8$) as described above and may also be formed when bonding with an oxide ceramic.

The pH-stabilizing agent can stabilize the pH of a mixed solution of ammonium fluoride and one or two selected from hydrogen peroxide and ammonium peroxodisulfate. It is favorable for the pH-stabilizing agent to be at least one selected from $HBF_4$, EDTA, NTA, CyDTA, DTPA, TTHA, GEDTA, glycine, dicarboxylic acid, tricarboxylic acid, oxycarboxylic acid, and their salts. These pH-stabilizing agents can adjust the pH to be within the range of not less than 4 and not more than 6.

It is favorable for the pH-stabilizing agent to be $HBF_4$. By using $HBF_4$, the pH can be adjusted to be not less than 4.0 and not more than 5.8. $HBF_4$ is tetrafluoroboric acid. $HBF_4$ is also called fluoboric acid.

$HBF_4$ may be combined with at least one selected from EDTA, NTA, CyDTA, DTPA, TTHA, GEDTA, glycine, dicarboxylic acid, tricarboxylic acid, oxycarboxylic acid, and their salts.

EDTA, NTA, CyDTA, DTPA, TTHA, GEDTA, glycine, dicarboxylic acid, tricarboxylic acid, oxycarboxylic acid, and their salts are called chelating agents. Chelating agents are effective in suppressing Cu precipitation. The brazing material layer includes Cu. The Cu ions in the etchant increase as the etching of the brazing material layer progresses. Cu precipitates when the Cu ions exceed a certain amount. The etching rate decreases when Cu that was once etched re-precipitates. Also, the pH of the etchant can be lowered by adding a chelating agent. One selected from CyDTA, glycine, dicarboxylic acid, tricarboxylic acid, oxycarboxylic acid, and their salts is favorable as the chelating agent. These chelating agents are materials that easily form complex ions with Cu ions. Also, when one selected from CyDTA, glycine, dicarboxylic acid, tricarboxylic acid, oxycarboxylic acid, and their salts is used as the chelating agent, it is favorable for the content in the etchant to be not less than 0.01 wt % and not more than 5 wt %. By using such a content, the pH of the etchant can be adjusted to be within the range of not less than 4.0 and not more than 5.8.

When the total mass of hydrogen peroxide, ammonium fluoride, and the pH-stabilizing agent is taken as 100 wt %, it is favorable for the hydrogen peroxide content to be not less than 5 wt % and not more than 90 wt %. Also, it is favorable for the ammonium fluoride content to be not less than 2 wt % and not more than 45 wt %. Also, it is favorable for the pH-stabilizing agent content to be not less than 2 wt % and not more than 50 wt %. The role of each component can be leveraged within these ranges. Also, the oxidation-reduction potential (ORP) when etching the brazing material can be increased. The rate of the brazing material etching can be increased thereby.

It is favorable for hydrogen peroxide, ammonium fluoride, and the pH-stabilizing agent each to be mixed as aqueous solutions. In a hydrogen peroxide-including aqueous solution, it is favorable for the hydrogen peroxide content to be not less than 5 wt % and not more than 70 wt %. In an ammonium fluoride-including aqueous solution, it is favorable for the ammonium fluoride content to be not less than 5 wt % and not more than 60 wt %. In a pH-stabilizing agent-including aqueous solution, it is favorable for the pH-stabilizing agent content to be not less than 5 wt % and not more than 60 wt %.

The brazing material etchant is adjusted by mixing the hydrogen peroxide-including aqueous solution, the ammonium fluoride-including aqueous solution, and the pH-stabilizing agent-including aqueous solution. The brazing material etchant may be diluted by mixing water. 0.5 to 2 L of water may be mixed when the total of the hydrogen peroxide-including aqueous solution, the ammonium fluoride-including aqueous solution, and the pH-stabilizing agent-including aqueous solution is 1 L (liter). Also, it is favorable for the mixing to be uniform by stirring sufficiently. For example, methods that mix by using a stirring bar such as a magnetic stirrer or the like and by rotating the stirring bar, methods that mix by using an agitator, methods that use a pump, etc., are examples of methods that mix by stirring.

It is favorable for the quality of the water to satisfy JIS-K-0557 (1998). The quality of A1 to A4 is indicated in JIS-K-0557. ISO 3696 is referenced by JIS-K-0557. Also, it is favorable for the impurity amounts included in the overall components of the etchant used to be as few as possible. By reducing the impurities included in the etchant, the replacement frequency of the liquid can be further reduced. It is favorable for the purity of solutions other than water that are added to the etchant also to be high.

When the total mass of ammonium peroxodisulfate, ammonium fluoride, and the pH-stabilizing agent is taken as 100 wt %, it is favorable for the ammonium peroxodisulfate content to be not less than 20 wt % and not more than 95 wt %, the ammonium fluoride content to be not less than 3 wt % and not more than 55 wt %, and the pH-stabilizing agent content to be not less than 2 wt % and not more than 60 wt %. The role of each component can be leveraged in these ranges. Also, the oxidation-reduction potential (ORP) when etching the brazing material can be increased. The etching rate is increased by setting the oxidation-reduction potential (ORP) to be high. Accordingly, by setting the oxidation-reduction potential (ORP) to be high, the rate at which the brazing material etching is performed can be increased while being controlled enough to cause the brazing material jutting portion to remain.

The brazing material etchant is adjusted by mixing the ammonium peroxodisulfate-including aqueous solution, the ammonium fluoride-including aqueous solution, and the pH-stabilizing agent-including aqueous solution. The brazing material etchant may be diluted by mixing water. Not less than 0.5 L and not more than 2 L of water may be mixed when the total of the ammonium peroxodisulfate-including aqueous solution, the ammonium fluoride-including aqueous solution, and the pH-stabilizing agent-including aqueous solution is 1 L (liter). Also, it is favorable for the mixing to be uniform by stirring sufficiently. It is favorable for the water to be purified water satisfying the quality of JIS-K-0557 (1998). The quality of A1 to A4 is indicated in JIS-K-0557.

The etching time can be reduced by etching the brazing material layer by using the brazing material etchant including hydrogen peroxide or ammonium peroxodisulfate described above. When the thickness of the brazing material layer is not more than 60 μm, the etching can be performed in 30 minutes or less.

It is favorable to perform the brazing material etching process while applying an ultrasonic wave to the bonded body via the brazing material etchant. Herein, an ultrasonic wave is defined as a sound wave having a frequency of not less than 10 kHz. It is favorable for the frequency of the ultrasonic wave to be not less than 10 kHz and not more than 100 kHz. When the frequency is less than 10 kHz, the effect of applying the ultrasonic wave may not be sufficiently obtained. On the other hand, when large, i.e., greater than 100 kHz, the effect of applying the ultrasonic wave may be too large, and the control of the etching rate may become difficult.

The brazing material etching time can be further reduced by performing the brazing material etching process while applying an ultrasonic wave. By performing the brazing material etching process while applying an ultrasonic wave, the time of one brazing material etching process can be set to be not more than 15 minutes. Although not particularly limited, it is favorable for the lower limit of the time of the brazing material etching process to be not less than 1 minute. When less than 1 minute, the removal effect of the brazing material layer and the oxidation effect of the brazing material layer are likely to be insufficient. When these effects are small, three or more brazing material etching processes may be necessary. Increasing the number of brazing material etching processes may require a larger production apparatus of the ceramic circuit board.

The brazing material etchant and/or etching conditions (the temperature, time, ultrasonic wave, etc.) may be changed when performing two or more brazing material etching processes.

In the brazing material etching process, it is also effective to heat the brazing material etchant to not less than 30° C. and not more than 70° C. By heating, the kinetic energy of the molecules included in the etchant can be increased, and the etching reaction of the brazing material can be stimulated. On the other hand, when the heating temperature is high, i.e., greater than 70° C., the etching rate may be too fast and cannot be controlled. Therefore, when the etchant is heated, it is favorable for the etchant to be not more than 70° C. Also, when heating, a constant temperature may be constantly maintained, or heating may be performed as necessary so that the temperature is not less than 30° C. and not more than 70° C.

The amount of the brazing material etchant is set to an amount in which the bonded body is completely immersed. Also, it is favorable for the aqueous solutions to mix as little possible between the etching processes and between the etching process and the chemical polishing process. When the aqueous solutions mix, the components of the aqueous solution used in the previous process may unfavorably affect the next process if a large amount of the liquid is adhered to the substrate surface. Accordingly, a cleaning process may be interposed between the etching processes and between the etching process and the chemical polishing process. When a cleaning process is not performed, the substrate may be positioned obliquely so that the aqueous solution components fall, or the aqueous solution components may be allowed to fall by using a perforated basket, mesh, etc. Or, natural drying may be used, or the aqueous solution may be blown off by blowing air, nitrogen, an inert gas, etc.

A chemical polishing process is performed after the brazing material etching process. The chemical polishing process includes a process of chemically polishing the end portion of the brazing material layer. When the brazing material layer is not completely removed after the chemical polishing process, it is effective to perform the brazing material etching process again. Also, it is more favorable to perform a cleaning process after the brazing material etching process and after the chemical polishing process. By performing the cleaning process, the brazing material etchant or the chemical polishing liquid can be prevented from remaining and unfavorably affecting the next process.

There are cases where copper ions of the brazing material layer receive electrons, causing copper to precipitate when etching the active metal reaction layer. The precipitation of copper is caused by the tendency for copper ions to receive electrons due to a high oxidation-reduction potential compared with titanium and hydrogen ions. That is, the precipitate is caused by the ionization tendency of copper being less than the ionization tendencies of titanium and hydrogen. Herein, the ionization tendency refers to the tendency to become a monovalent cation. That is, atoms that have small ionization tendencies easily receive electrons but do not easily become ions. Copper ions are generated by the copper in the copper plate or the brazing material. When precipitated copper is present, the shape and length of the jutting portion can no longer be controlled. Accordingly, it is necessary to remove such copper precipitated at the brazing material layer end portion in the chemical polishing process. It is favorable to use a chemical polishing liquid including sulfuric acid or hydrochloric acid in the chemical polishing process. Although the chemical polishing liquid may include both sulfuric acid and hydrochloric acid, it is favorable to include only one of sulfuric acid or hydrochloric acid. It is favorable for the chemical polishing liquid to be a sulfuric acid aqueous solution, a hydrochloric acid aqueous solution, or an aqueous solution in which sulfuric acid and hydrogen peroxide are mixed. The sulfuric acid aqueous solution also includes an aqueous solution including a sulfate such as sodium thiosulfate ($Na_2S_2O_3$), etc.

It is favorable for the quality of the sulfuric acid to satisfy JIS-K-8951 (2006). It is favorable for the quality of the hydrochloric acid to satisfy JIS-K-8180 (2015). JIS-K-8951 and JIS-K-8180 correspond to ISO 6352-2. Also, it is favorable for the quality of the sodium thiosulfate to satisfy JIS-K-8638 (2011). JIS-K-8638 is referenced by ISO 6352-2.

It is favorable for the sulfuric acid concentration of the sulfuric acid aqueous solution to be within the range of not less than 0.5 wt % and not more than 25 wt %. It is favorable for the hydrochloric acid concentration of the hydrochloric acid aqueous solution to be within the range of not less than 0.5 wt % and not more than 20 wt %. It is favorable for the total of sulfuric acid and hydrogen peroxide of the aqueous solution in which sulfuric acid and hydrogen peroxide are mixed to be within the range of not less than 0.5 wt % and not more than 30 wt %. When the concentrations are less than 0.5 wt %, the chemical polishing effect may be insufficient. When the concentration is high, i.e., greater than 30 wt %, the chemical polishing effect may become too high. When the chemical polishing effect becomes too high, the size adjustment of the brazing material jutting portion becomes difficult. It is therefore favorable for the concentrations of sulfuric acid, hydrochloric acid, and hydrogen peroxide to be within the range of not less than 0.5 wt % and not more than 20 wt %. More favorably, the concentrations are within the range of not less than 1 wt % and not more than 10 wt %. Also, when a sodium thiosulfate aqueous solution is used as the sulfuric acid aqueous solution, it is favorable to add not less than 0.01 wt % and not more than 1 wt % of a chelating agent. The pH can be lowered by adding a chelating agent.

It is favorable for one chemical polishing process to be not more than 5 minutes. When one chemical polishing process is long, i.e., greater than 5 minutes, the copper plate surface may undesirably become rough. When not more than 5 minutes, the surface roughness Ra of the copper plate is not more than 2 μm. Also, a flat surface of the copper plate having a surface roughness Ra of not more than 1 μm can be maintained by setting the chemical polishing process time to be not less than 20 seconds and not more than 2 minutes. Therefore, even when the brazing material etching process is performed after detaching the etching resist coated onto the copper plate surface in the copper etching process, a flat surface of the copper plate having a surface roughness Ra of not less than 0.1 μm and not more than 1 μm is possible. Discrepancies caused by reactions between the etching resist and the brazing material etchant or between the etching resist and the chemical polishing liquid can be avoided.

Two or more types of chemical polishing liquids may be used in one chemical polishing process. In other words, in one chemical polishing process, chemical polishing may be performed using a chemical polishing liquid including one component, and then chemical polishing may be performed using a chemical polishing liquid including another component. Also, when two or more chemical polishing processes are performed, the chemical polishing liquid and/or conditions (the time, etc.) may be changed for each process. Also, the shape of the jutting portion can be made uniform by performing a second brazing material etching process. It is therefore favorable to perform the second brazing material etching process as necessary. Also, similarly to the first brazing material etching process, it is more favorable to include a second chemical polishing process after the second brazing material etching process. Thus, by including the second chemical polishing process, the copper that precipitated in the second brazing material etching process can be removed. The use of the terms chemical polishing and etching herein will now be described. "Chemical polishing" refers to a process in which the amount that is removed is less than a process referred to as "etching". Thus, when etching or chemical polishing is performed using the solutions described above, multiple bonded bodies may be simultaneously etched or chemically polished, or the bonded bodies may be etched or chemically polished one at a time. The number of bonded bodies performed simultaneously in each process is not particularly limited. Also, in the processes performed using each etching solution or chemical polishing solution, the way that the solution is used is not particularly limited. The bonded body may be placed with any orientation with respect to the container containing each solution in the etching or solution chemical polishing process; and each solution may be sprayed onto the bonded body as a spray.

The finishing cleaning process is the final cleaning process. Thereafter, the finishing cleaning process also is called simply the cleaning process.

In the cleaning process, at least one selected from water cleaning, alkaline cleaning, and alcohol cleaning is performed. The water cleaning may be an immersion or water-flow type. The immersion type is a method in which the bonded body is immersed in a cleaning tank containing water. The water-flow type is a method in which the cleaning water is caused to flow. The water-flow type includes a shower type or a method in which the cleaning water is caused to flow inside the cleaning tank. In a method in which the flow rate is adjusted by providing nozzles, the method may be such that the nozzles are located at both the front and back surfaces of the substrate, and the front and back are cleaned at once. Thus, by cleaning the front and back at once, the bonded body can be cleaned more efficiently.

Also, cleaning processes may be included after the etching process and after the chemical polishing. In such a cleaning process, a normal water cleaning may be performed, or a water cleaning in which the flow rate is controlled may be performed. The normal cleaning process is a method in which the bonded body is immersed in a water cleaning tank. As described above, when the bonded body is immersed in purified water, it is sufficient for the immersion time to be 10 seconds to 10 minutes. Also, the individual cleaning processes may be either batch or continuous. The batch technique is a method in which the cleaning process is performed by placing multiple bonded bodies in a cleaning basket. The continuous technique is a method in which the cleaning process is performed while conveying multiple bonded bodies by a belt conveyor. When performing the cleaning, an ultrasonic wave may be applied via the water. An effect of increasing the cleaning efficiency can be expected by applying the ultrasonic wave. Also, when an etching process or a chemical polishing process is performed as the next process, a small amount of a component of the solution of the next process may be added to the cleaning water after each etching process or chemical polishing process. Thus, by adding the component of the solution of the next process to the cleaning water, the thinning of the solution of the next process by the cleaning can be suppressed.

When only water cleaning is performed, it is favorable for at least one flow-type water cleaning process to be performed. In particular, it is favorable for the final finishing cleaning process of the cleaning process to be a flow-type water cleaning process. When only water cleanings are performed, the water-flow cleaning processes of the cleaning process may be performed many times. Also, multiple cleaning methods may be combined in one cleaning process. It is favorable for these cleanings to clean not only the conductor part but also the entire bonded body. Also, by performing cleaning between the etching processes and between the etching process and the chemical polishing process, aqueous solutions of different compositions can be prevented from mixing with each other, the replacement frequency of the etchant can be reduced, and the chemical liquid addition frequency for the adjusting of the components can be reduced. It is therefore more favorable to include cleaning processes between the etching processes and between the etching process and the chemical polishing process.

In the water cleaning, it is favorable for the flow rate to be not less than 1.3 L (liter)/minute. If the flow rate is not less than 1.3 L/minute, the effect of rinsing the components of the aqueous solution adhered to the copper plate surface is sufficiently obtained. When the flow rate is less than 1.3 L/minute, the rinsing effect may be insufficient. For example, according to a method in which the bonded body is immersed and left in a cleaning tank containing water, the effect of rinsing the components of the aqueous solution is insufficiently obtained because the flow rate is insufficient. Although not particularly limited, it is favorable for the upper limit of the flow rate to be not more than 10 L/minute. When the flow rate is large, i.e., greater than 10 L/minute, the water pressure may be too high and the copper plate surface may deform. It is therefore favorable for the flow rate of the water cleaning to be not less than 1.3 L/minute and not more than 10 L/minute. More favorably, the flow rate of the water cleaning is not less than 1.5 L/minute and not more than 6 L/minute.

Methods in which the control is performed by circulating the water contained in the cleaning tank, methods in which the control is performed using a nozzle, etc., are examples of methods for adjusting the flow rate. A method in which the flow rate is controlled using a nozzle is favorable. The flow rate is easily controlled by using a nozzle. According to the method in which the water contained in the cleaning tank is circulated, the control of the flow rate may be difficult when the amount of the water is high. When a nozzle is used, the flow rate of the water sprayed from the nozzle is set to be not less than 1.3 L/minute. Also, an ultrasonic wave may be applied to the water; and carbonic acid or oxygen may be dissolved in the water.

It is favorable for the distance between the nozzle and the bonded body to be within the range of not less than 5 cm and not more than 40 cm. It is more favorable for the distance to be within the range of not less than 5 cm and not more than 20 cm. When within these ranges, the amount of the water striking the bonded body is more easily adjusted. The impact shape of the water sprayed from the nozzle can have various shapes such as point, circular, elliptic, flattened, quadrilateral, etc. Various configurations such as cone-shaped, fan-shaped, etc., are applicable as the type of the nozzle. When nozzles are utilized, multiple nozzles per bonded body may be used, and the front conductor part and the back conductor part may be simultaneously cleaned. Also, it is favorable to perform the cleaning on the entire bonded body surface. Thus, the method in which nozzles are provided and the flow rate is adjusted to clean the entire bonded body surface may be a method in which nozzles are located at both the front and back surfaces of the substrate and the front and back are cleaned at once. Thus, by cleaning the front and back at once, the cleaning can be more efficient.

It is favorable for the water amount that impacts the bonded body to be within the range of not less than 0.01 $L/(minute \cdot cm^2)$ and not more than 0.1 $L/(minute \cdot cm^2)$ per nozzle. The water amount that impacts the bonded body is called the water impact amount. The water impact amount indicates the water amount impacting per 1 $cm^2$ when the bonded body is viewed from above. The adjustment of the water impact amount on the bonded body can be adjusted using the water amount from the nozzle, the nozzle type, the distance between nozzles, etc., described above. Also, air jets can be combined when spraying the water from the nozzle. An ultrasonic wave may be provided in the cleaning process. It is also effective to perform the cleaning process while conveying the bonded body. At this time, the bonded body may be obliquely positioned to increase the cleaning efficiency (the recovery efficiency of the liquid) and the installation area efficiency. Oblique means that the orientation of at least one side of the bonded body is not parallel to a horizontal plane perpendicular to the direction of gravity. It is more favorable for the angle between the horizontal plane and the at least one side to be not less than 10 degrees but less than 90 degrees. An efficient method is to set the flow rate from the nozzle to be not less than 1.3 L/minute, and to set the water impact amount on the bonded body to be within the range of not less than 0.01 $L/minute/cm^2$ and not more than 0.1 $L/minute/cm^2$ per nozzle while conveying the bonded body.

It is favorable for the quality of the water to satisfy JIS-K-0557 (1998). JIS-K-0557 indicates the quality of A1 to A4. ISO 3696 is referenced by JIS-K-0557.

Alkaline cleaning refers to the process of cleaning the bonded body with an alkaline aqueous solution having a pH of not less than 10. Aqueous solutions such as organic alkaline, metal hydroxide, a salt of a metal hydroxide and a weak acid, etc., are examples of alkaline aqueous solutions having a pH of not less than 10. In particular, lithium, potassium, sodium, barium, calcium, etc., are examples of types of metals when metal hydroxides and their salts are used. When Kb (the base dissociation constant) is too small, the necessary solute amount increases, and so it is favorable for the type of metal of the metal hydroxide and its salt that is used to be selected from potassium, sodium, and lithium.

In particular, when considering cost, sodium hydroxide, sodium metasilicate, sodium carbonate, sodium phosphate, and tetrasodium diphosphate are favorable, and an aqueous solution including at least one selected from these sodium compounds is favorable. It is more favorable for the aqueous solution to include not less than 0.5 mass % and not more than 5 mass % of these components. Alkaline cleaning is effective for suppressing contamination of the etchant by removing organic substances such as the resist of the copper plate surface, etc.

It is favorable for the purity of these alkaline aqueous solutions to be high. It is more favorable for the purity to be not less than 96 mass %. When the purity is less than 96 mass %, the replacement frequency of the cleaning liquid may increase. Also, it is more favorable for the purity to be not less than 98 mass %. The purity (mass %) is the value of the sum of the mass of the solvent and the alkaline compound (sum of the compounds if mixed) divided by the mass of the entire aqueous solution, multiplied by 100, and expressed in %.

Organic compounds are often used in resists. Organic compounds are soluble in organic solvents because organic compounds have lower polarities than water.

Therefore, when the resist includes an organic compound, cleaning that uses alcohols or ketones may be performed. Isopropanol, methanol, butanol, hexanol, ethanol, etc., are examples of alcohols. Also, acetone, etc., are examples of ketones. Ethanol or isopropanol are favorable when the solubility and volatility of organic compounds also are considered. Isopropanol is CAS Registry Number 67-63-0, and its IUPAC name is 2-propanol. Isopropanol is also called IPA or isopropyl alcohol.

It is favorable for the purity of alcohols other than water and such solvent components to be not less than 99 mass %. When the purity other than water and solvent components is less than 99 mass % for alcohols or ketones used in the cleaning, the replacement frequency of the cleaning liquid may increase.

Also, a mixture of two or more types of alcohols may be used in the alcohol cleaning. Furthermore, alcohol may be mixed with water. When alcohol is mixed with water, it is favorable for the quality of the water that is used to satisfy JIS-K-0557 (1998). Ketones such as acetone, etc., may be added to alcohols as a solvent. That is, it is favorable for the impurity amount other than water or solvents in the solution used in the alcohol cleaning to be not more than 1 mass %. Cleaning that uses an alcohol is called alcohol cleaning.

When considering cost, alkaline cleaning or water cleaning is more favorable than alcohol cleaning as cleaning method. Also, multiple cleaning methods may be combined such as performing water cleaning after alkaline cleaning, etc. Also, it is favorable to include a drying process after these cleaning processes.

By performing a cleaning process such as those described above, the replacement frequency of the etchant can be reduced. Also, it is favorable to perform the cleaning process after the process of removing the resist. When the process of removing the resist is performed multiple times, it is favorable to perform a cleaning process each time.

It is favorable to perform the cleaning methods described above as a finishing cleaning process. The finishing cleaning process is the final cleaning process performed in the manufacturing processes of the ceramic circuit board. For example, when performing the final resist removal process, the cleaning after the final resist removal process may be performed using the cleaning methods described above; and the cleaning after the other resist removal processes may be normal water cleaning. In such a case, it is favorable for the time of the cleaning process after the final resist removal process to be set to be long compared to the times of the other cleaning processes.

Cleaning methods also include methods that use a chlorine-based cleaning agent. A chlorine-based cleaning agent may increase the chlorine amount at the copper plate surface. The increase of the chlorine amount may unfavorably affect the bonding reliability when bonding a circuit board to the bonding layer or plating film of a semiconductor element. Therefore, chlorine-based cleaning agents are unfavorable compared to the cleaning methods described above. Also, cleaning processes that use water vapor or ozone water are unfavorable because the copper plate may be oxidized. Therefore, cleaning processes such as water cleaning, alkaline cleaning, or alcohol cleaning are favorable.

The ceramic circuit board according to the embodiment can be manufactured by the processes described above. Specifically, the bonded body is patterned into the ceramic circuit board by providing the copper member with a patterned configuration by at least one copper etching process and by dividing the brazing material layer by at least one brazing material etching process. The bonded body may be patterned into the ceramic circuit board by dividing the brazing material layer by a chemical polishing process after the brazing material etching process.

The drying process may be natural drying. To efficiently dry, it is favorable to perform at least one processing with an easily-volatilized solution, centrifugal force processing, air blow processing, etc., in the drying process. Also, when at least one cleaning process is performed, it is favorable to include at least one drying process after the cleaning process. In particular, it is favorable for the timing of the drying process to include sometime after the finishing cleaning process. For example, when water is used in the cleaning process, and when a large amount of water is adhered to the bonded body, the components of the etchant or chemical polishing liquid may be thinned when the next process is performed. Accordingly, compared to when a drying process is not included, the replacement frequency of the liquid of the next process may increase. When a drying process is included after the finishing cleaning process, the yield is increased by drying the bonded body more efficiently than natural drying. Also, by efficient drying, the oxidization is low because the time in contact with oxygen is shorter than when natural drying is used.

Processing with an easily-volatilized solution, centrifugal force processing, air blow processing, etc., are examples of drying processes. Multiple drying processes may be combined. The water that remains on the bonded body after cleaning may be rinsed away by using easily-volatilized solvent including alcohols such as methanol, ethanol, isopropanol, or the like, ketones such as acetone, etc. Also, mixtures of alcohols and ketones may be used. In such a case, considering safety such as flammability, etc., it is favorable to use isopropanol. Also, the remaining water droplets may be removed using a centrifugal force by rotating the bonded body after cleaning.

Also, the bonded body may be positioned obliquely. Oblique refers to the state in which the orientation of any one or more sides of the bonded body is not parallel to the horizontal direction, where any orientation existing in a plane perpendicular to the direction of gravity is taken as the horizontal direction. In such a case, when the angle between the horizontal direction and the direction of gravity is taken to be 90 degrees, it is more favorable for the angle between the horizontal direction and the orientation of any one or more sides of the bonded body to be not less than 10 degrees and not more than 90 degrees. It is more favorable for the orientation of the bonded body to be oblique. Thus, by setting the orientation of the bonded body to be oblique, the water droplets adhered to the bonded body easily fall due to gravity. For example, making the diagonals of the bonded body oblique is an example of a method for making oblique.

Also, the bonded body may be dried by being stood so that the diagonals are about parallel to the direction of gravity.

It is favorable to blow off the remaining water droplets on the bonded body thus dried somewhat by blowing dry air or nitrogen gas. A method in which air, dry air, or nitrogen gas is blown is also called an air knife. An air knife is one type of air blowing.

To more reliably dry the bonded body thus obtained, air may strike the bonded body with a temperature of not less than 10° C., a humidity of not more than 70%, and an air velocity of not less than 20 m/s and not more than 150 m/s. The drying process thus striking the bonded body with air is called air blowing. Also, a favorable air temperature in the air blow process is not less than ° C. and not more than 150° C., and more favorably not less than 15° C. but less than 100° C. When this temperature is exceeded, the copper member surface may be oxidized by heat. Also, a favorable humidity in the air blow process is not less than 5% and not more than 70%. When the humidity is greater than 70%, the time of the drying process may lengthen. The cost may increase when making the humidity less than 5%. It is favorable for the air velocity to be not less than 20 m/s and not more than 150 m/s. It is more favorable for the air velocity to be not less than 20 m/s and not more than 100 m/s. Drying takes time when the air velocity is too low. Also, when the air velocity is too high, unfavorable effects on the conveyance of the copper plate may occur. When performing the drying processes, oxidization of the copper plate surface, i.e., the conductor part, by the heat of the warm air can be suppressed by combining other drying processes to reduce the drying time of applying warm air when using the warm air drying process. Therefore, multiple drying processes may be combined.

FIG. 1 is a process drawing illustrating a method for manufacturing a ceramic circuit board according to a first embodiment.

The manufacturing method according to the first embodiment includes a process of preparing a bonded body, a first copper etching process 1-1, a first cleaning process 4-1, a first brazing material etching process 2-1, a first chemical polishing process 3-1, and a finishing cleaning process 5. A ceramic substrate and a copper member are bonded in the bonded body. The copper member and the copper alloy layer are etched in the first copper etching process. The bonded body processed in the first copper etching process is cleaned in the first cleaning process 4-1. An active metal reaction layer exposed by the first copper etching process is etched in the first brazing material etching process. The copper that precipitated at the end portion of the brazing material layer exposed by the first brazing material etching process is removed in the first chemical polishing process. The bonded body (the ceramic circuit board) is cleaned in the finishing cleaning process.

At least one of a cleaning process or a drying process may be performed between the first brazing material etching process and the first chemical polishing process as necessary. At least one means that both a drying process and a cleaning process may be performed.

Figure 2:
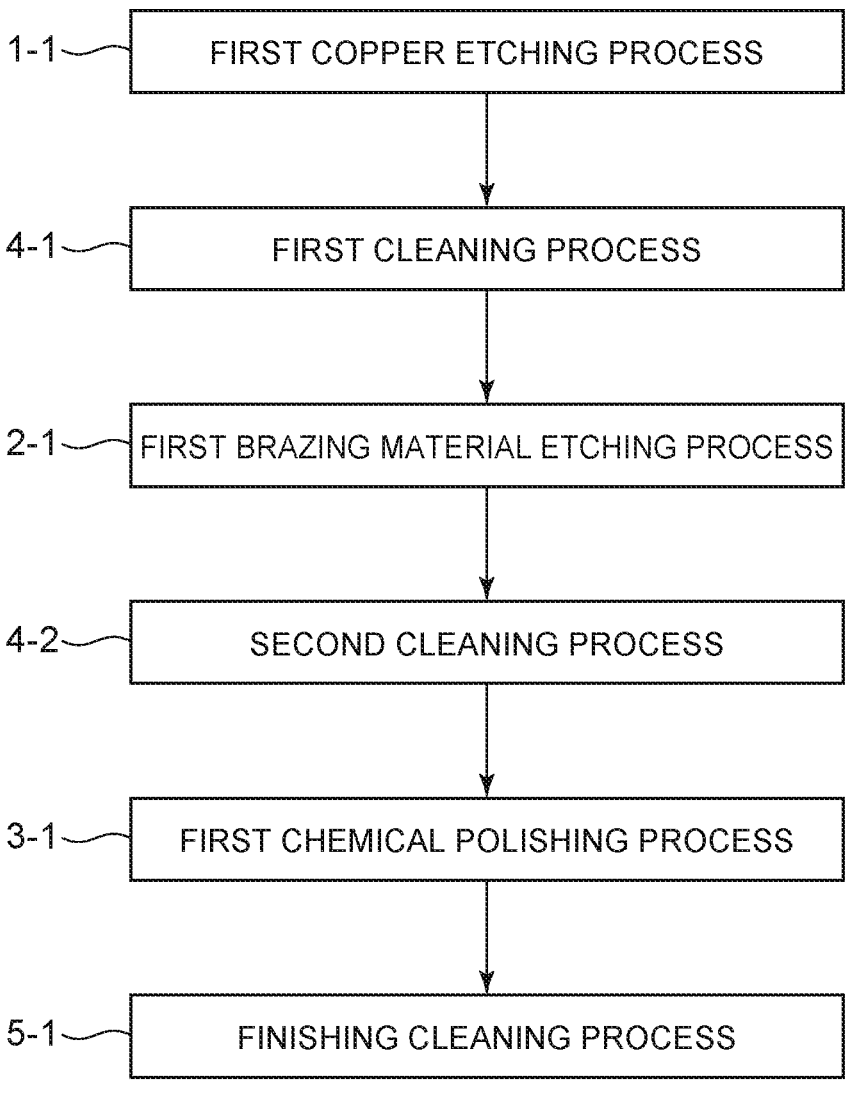
FIG. 2 is a process drawing illustrating a second embodiment.

FIG. 2 is a process drawing illustrating a method for manufacturing a ceramic circuit board according to a second embodiment. The manufacturing method according to the second embodiment differs from the first embodiment in that two cleaning processes are performed before the finishing cleaning process. The manufacturing method according to the second embodiment includes the first copper etching process 1, the first cleaning process 4-1, the first brazing material etching process 2-1, a second cleaning process 4-2, the first chemical polishing process 3-1, and a finishing cleaning process 5-1. Cleaning processes are included after the first brazing material etching process 2-1 and after the first chemical polishing process 3-1. By performing the cleaning processes, the etchant or the chemical polishing liquid can be prevented from remaining on the bonded body. Also, drying processes are performed after the cleaning processes as necessary.

Figure 3:
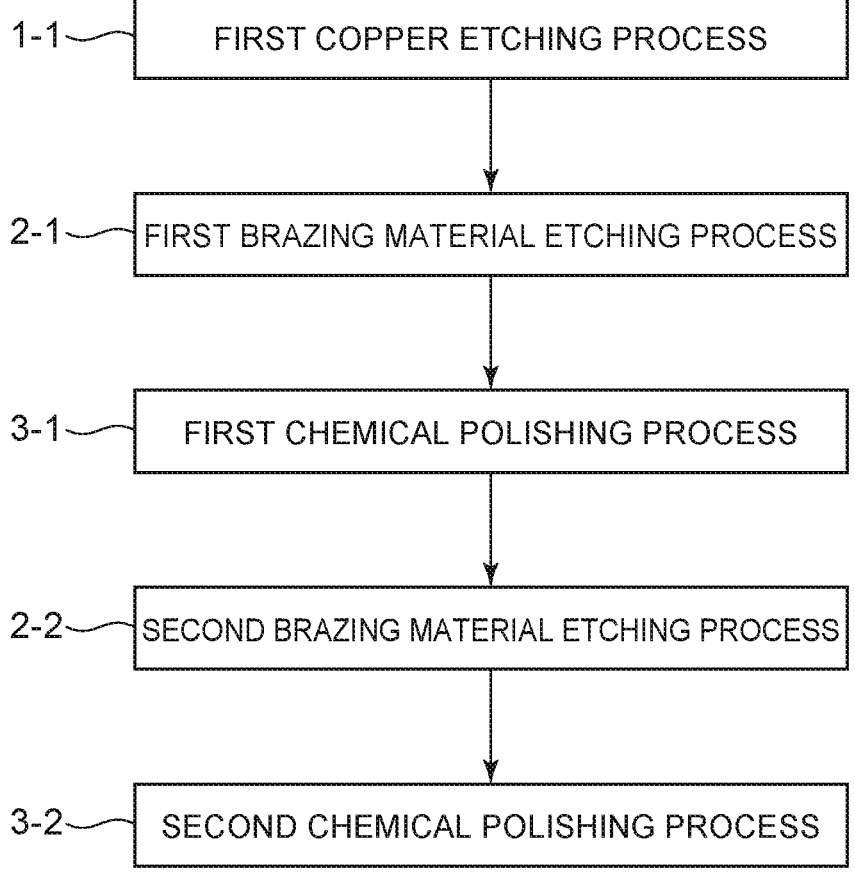
FIG. 3 is a process drawing illustrating a third embodiment.

FIG. 3 is a process drawing illustrating a method for manufacturing a ceramic circuit board according to a third embodiment. The manufacturing method according to the third embodiment includes the first copper etching process 1, the first brazing material etching process 2-1, the first chemical polishing process 3-1, a second brazing material etching process 2-2, and a second chemical polishing process 3-2. As shown in FIG. 3, the brazing material etching process and the chemical polishing process may be performed repeatedly. The brazing material etching process and the chemical polishing process are alternately performed. A cleaning process may be performed between the brazing material etching process and the chemical polishing process. The manufacturing method according to the third embodiment is effective when the brazing material layer cannot be sufficiently removed by the first brazing material etching process 2-1 and the first chemical polishing process 3-1. The components of the brazing material etchant used in the second brazing material etching process 2-2 may be the same as or different from the components of the brazing material etchant used in the first brazing material etching process 2-1. The components of the chemical polishing liquid used in the second chemical polishing process 3-2 may be the same as or different from the components of the chemical polishing liquid used in the first chemical polishing process 3-1. A brazing material etching process and a chemical polishing process also may be performed after the second chemical polishing process 3-2. At least one of a cleaning process or a drying process may be performed between the brazing material etching process and the chemical polishing process.

Figure 4:
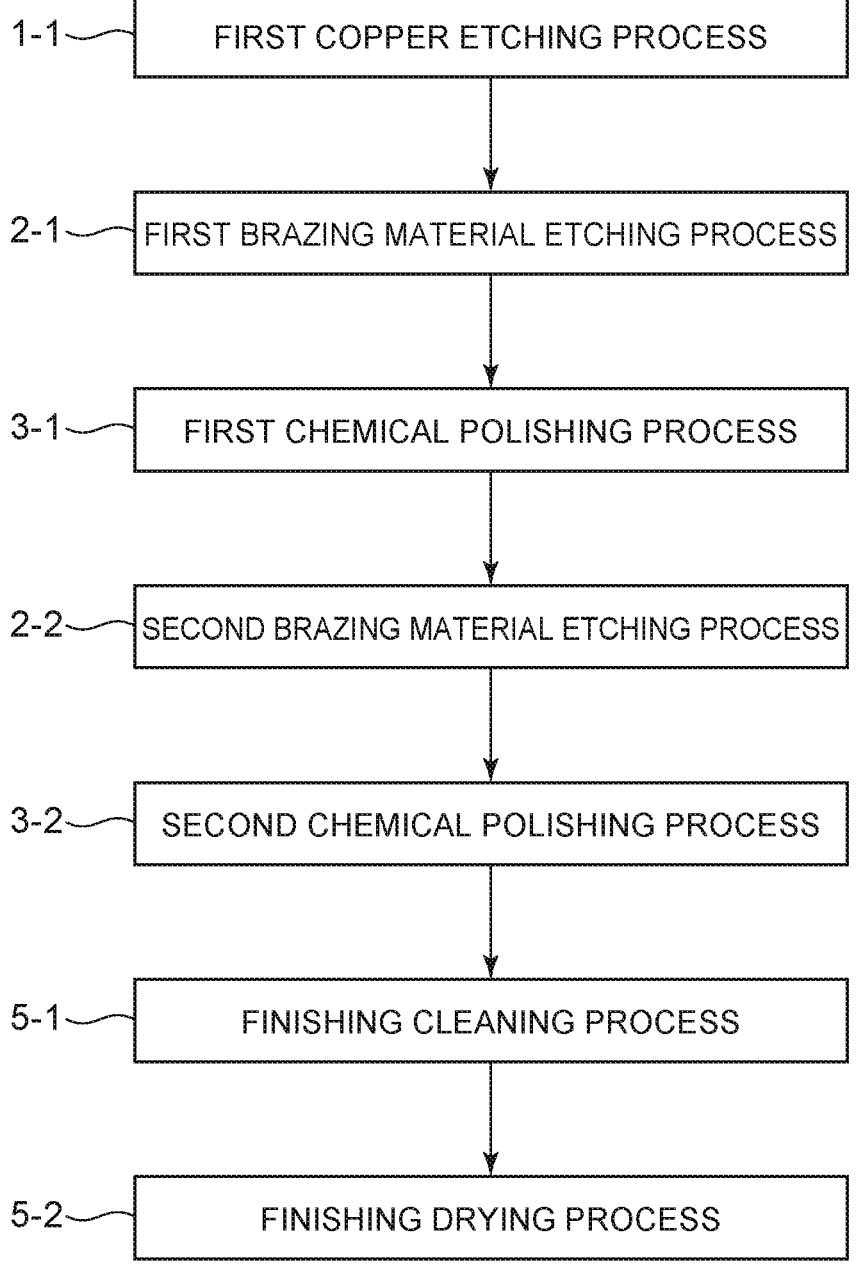
FIG. 4 is a process drawing illustrating a fourth embodiment.

FIG. 4 is a process drawing illustrating a method for manufacturing a ceramic circuit board according to a fourth embodiment. Compared to the third embodiment, the manufacturing method according to the fourth embodiment further includes the finishing cleaning process 5-1 and a finishing drying process 5-2. The finishing cleaning process 5-1 is performed after the final chemical polishing process. The finishing drying process 5-2 is performed after the finishing cleaning process 5-1.

Figure 5:
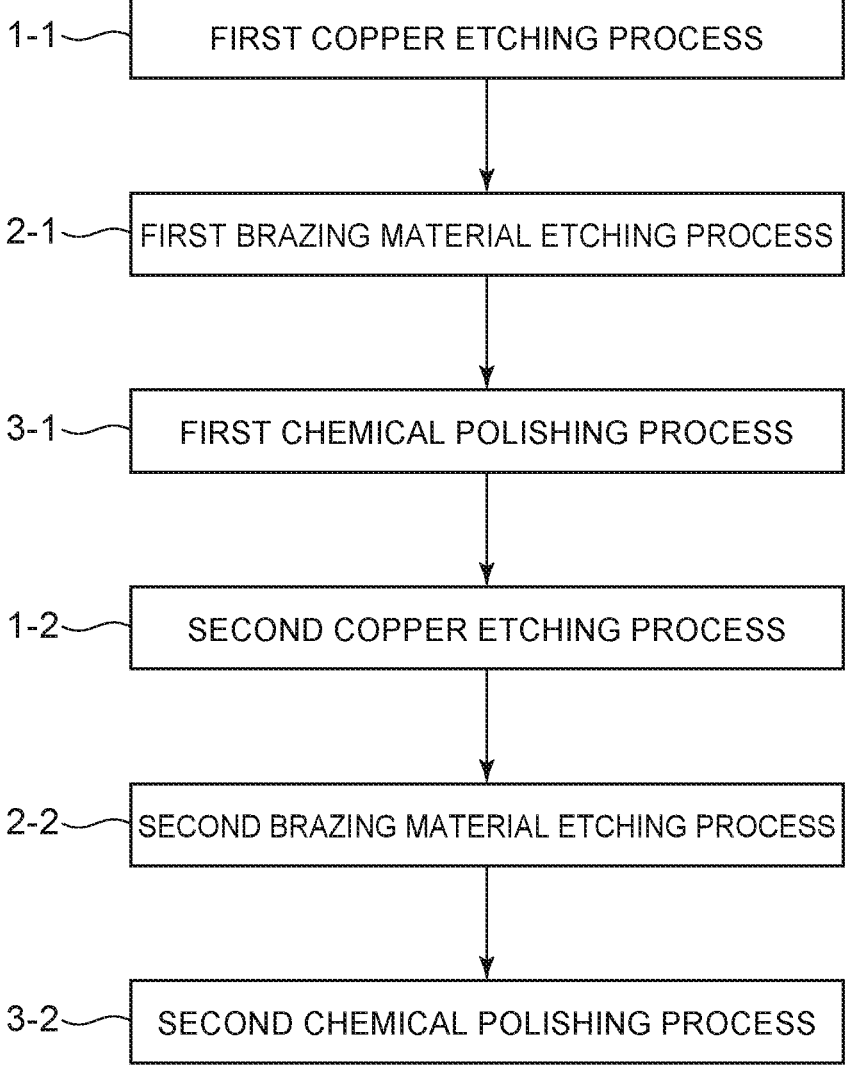
FIG. 5 is a process drawing illustrating a fifth embodiment.

FIG. 5 is a process drawing illustrating a method for manufacturing a ceramic circuit board according to a fifth embodiment. Compared to the third embodiment, the manufacturing method according to the fifth embodiment further includes a second copper etching process 1-2. The second copper etching process is performed after the first chemical polishing process. As shown in FIG. 5, the second brazing material etching process 2-2 and the second chemical polishing process 3-2 may be performed after the second copper etching process 1-2. Subsequently, the finishing cleaning process 5-1 and the finishing drying process 5-2 may be performed similarly to the example shown in FIG. 4.

The other processes for the ceramic circuit boards obtained by the manufacturing methods according to embodiments are not particularly limited. For example, a process of applying a corrosion inhibitor before the finishing cleaning process may be included, and a process of performing plating processing on the obtained circuit board may be included. Also, a semiconductor device may be made by mounting a semiconductor element directly to a copper member provided with a patterned configuration, or the semiconductor element may be mounted via a solder layer or silver layer. Also, the corrosion inhibitor that is used may be a benzotriazole compound or the like, or may be non-benzotriazole. Although not particularly limited, it is more favorable for the timing of the process of applying the corrosion inhibitor to be such that the finishing cleaning process is located after applying the corrosion inhibitor.

FIGS. 6A to 6D are cross-sectional views illustrating the manufacturing processes of the ceramic circuit board according to the embodiment. In FIGS. 6A to 6D, 10 is a bonded body, 11 is a ceramic substrate, 12 is a brazing material layer, and 13 is a copper plate. The brazing material layer 12 includes a copper alloy layer 12a and an active metal brazing material layer 12b. The active metal brazing material layer 12b is positioned between the ceramic substrate 11 and the copper alloy layer 12a.

Figure 6A:
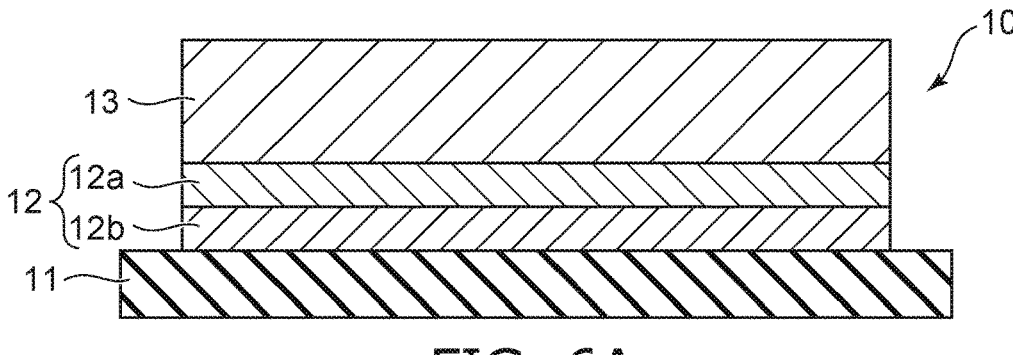
FIGS. 6A to 6D are cross-sectional views illustrating manufacturing processes of an embodiment.
Figure 6B:
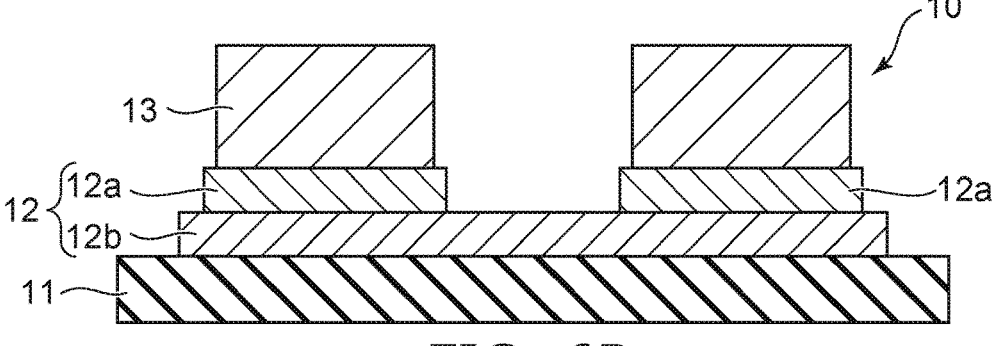
Figure 6C:
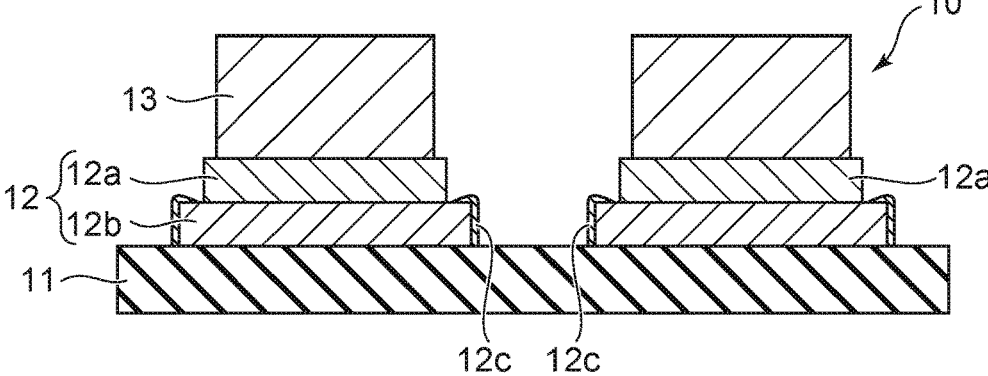
Figure 6D:
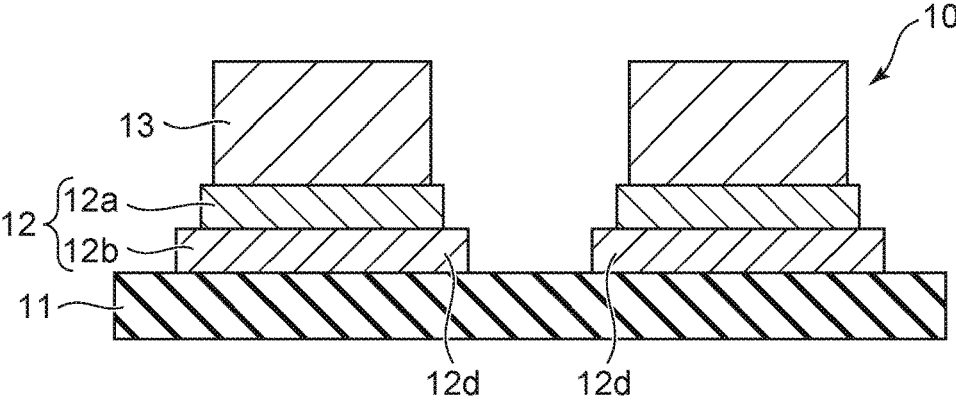

FIG. 6A illustrates the bonded body that is prepared. The copper plate is bonded to one surface of the ceramic substrate via the brazing material layer. A portion of the copper plate is removed by the first copper etching process. As shown in FIG. 6B, the active metal brazing material layer is exposed between the patterned configurations provided in the copper plate. Herein, a copper member that is divided into a plurality and provided with a circuit configuration by the etching also is called a "copper plate" for convenience of description. FIG. 6C is the state in which a portion of the active metal brazing material layer exposed by the first brazing material etching process is removed. A precipitate 12c at which Cu in the etchant has precipitated exists at the end portion of the brazing material layer 12. FIG. 6D shows the state after the first chemical polishing process. The precipitate 12c of the brazing material layer end portion is removed by the first chemical polishing process. The portion of the brazing material layer 12 jutting laterally from the copper plate after the precipitate is removed is a brazing material jutting portion 12d.

For example, the bonded body in the states shown in FIGS. 6C and 6D is a ceramic circuit board in which the patterned configurations are electrically insulated from each other.

Although not illustrated, when there is a possibility that the brazing material layer may remain after the first brazing material etching process, a second brazing material etching process and a second chemical polishing process may be performed as illustrated in FIGS. 3 and 4. A third brazing material etching process and a third chemical polishing process may be performed after the second brazing material etching process as necessary. Also, FIG. 6 shows an etching process of the copper plate and the brazing material layer located at the surface of the ceramic substrate. When the copper plate also is bonded to the back side of the ceramic substrate via a brazing material layer, an etching process of the copper plate and brazing material layer of the back side can be performed as necessary. Also, by manufacturing multiple ceramic circuit boards continuously, the necessary amount of the etchant is added when the concentration of the brazing material etchant changes. This is similar for the chemical polishing liquid as well.

As a criterion of the concentration change of the brazing material etchant, it is effective to replenish the reduced amount of hydrogen peroxide when the concentration of hydrogen peroxide has decreased 10 to 20 wt % from the initial concentration. This is similar when ammonium peroxodisulfate is used. Hydrogen peroxide or ammonium peroxodisulfate functions as an ionizing or oxidizing agent of the active metal brazing material layer components. The etching process of the active metal brazing material layer starts as these functions are manifested. Because hydrogen peroxide or ammonium peroxodisulfate is consumed first, the concentration of hydrogen peroxide or ammonium per-oxodisulfate is the most pronounced in the etchant composition. Accordingly, it is favorable to check these concentration changes as the criterion for replenishment. Also, the pH of the brazing material etchant changes as the hydrogen peroxide or ammonium peroxodisulfate decreases. A method of replenishing by measuring the pH of the brazing material etchant also is effective.

The consumption of the brazing material etchant changes according to the area of the active metal brazing material layer to be etched. When multiple ceramic circuit boards are etched at once, the total area of the active metal brazing material layers to be etched is used. A method of replenishing while confirming the component amount and/or pH of the brazing material etchant is favorable. A technique in which the brazing material etching process progresses while completely replacing the brazing material etchant may be used.

Also, compared with a brazing material layer that includes Ag, the life of the etchant can be extended because the brazing material layer does not include Ag. As described above, it is possible to reduce the number of brazing material etching processes and/or reduce the processing time. The life of the etchant can be extended thereby. As an example, when an etching process is performed three times for a brazing material layer including Ag, it is sufficient to perform the etching process once or twice for a brazing material layer not including Ag. The life of the etchant can be extended because the amount of processing is reduced.

Also, the concentration of the etchant can be lowered when the number of brazing material etching processes and the processing time are respectively the same. The etchant concentration for an etchant of a brazing material layer including Ag can be within the range of not less than 40 wt % and not more than 70 wt %. As an example, it is assumed that etching processing of a brazing material layer including Ag is performed using a brazing material etchant including 30 wt % of hydrogen peroxide. When etching a brazing material layer not including Ag, the processing is possible with a hydrogen peroxide concentration within the range of not less than 12 wt % and not more than 21 wt %.

The first copper etching process of the copper plate and the copper alloy layer of the brazing material layer is patterning of the bonded body before the patterning by etching the active metal brazing material layer. In the first copper etching process, it is favorable to pattern these members into a patterned configuration by etching the copper plate and the copper alloy layer after coating an etching resist on the copper plate. By coating the etching resist, the patterned configuration and the distance between the patterns can be arbitrarily changed.

After the first copper etching process, it is favorable to perform brazing material patterning by etching the bonded body having the etching resist removed. The removal of the etching resist can prevent the etching resist from causing discrepancies by reacting with the brazing material etchant or the chemical polishing liquid. If the etching resist reacts, the pH of the brazing material etchant may exceed 6.

When a combination of $HBF_4$ and a chelating agent is used as a pH-stabilizing agent, the pH of the brazing material etchant can be prevented from exceeding 6 even when the brazing material layer is etched while the etching resist remains.

According to the method for manufacturing the ceramic circuit board according to the embodiment, the number of brazing material etching processes can be set to, for example, two or more. Also, damage to the copper plate is low because the time of one brazing material etching process can be not more than 15 minutes. Therefore, even when the brazing material etching process is performed after removing the etching resist, the surface roughness Ra of the copper plate can be not less than 0.2 μm and not more than 1 μm. By setting the surface roughness Ra of the copper plate to be not less than 0.2 μm and not more than 1 μm beforehand, the adhesion of the copper plate with the mold resin is improved. A semiconductor device in which a semiconductor element is mounted to a ceramic circuit board is molded using a resin. A process of roughening the copper plate surface is performed to increase the adhesion strength between the copper plate and the resin. According to the method for manufacturing the ceramic circuit board according to the embodiment, the surface roughness of the copper plate surface can be controlled by performing the brazing material etching process. It is therefore unnecessary to perform a special process of roughening the copper plate surface such as blasting, etc. The manufacturing efficiency also is increased in this respect. It is especially favorable for a method for manufacturing a ceramic circuit board that is resin-molded.

According to a method for manufacturing the ceramic circuit board such as that described above, the time of one brazing material etching process can be reduced to be not more than 15 minutes, or even not more than 7 minutes. Also, the ceramic circuit board can be manufactured even when the distance between the patterns is narrow, i.e., not more than 2 mm, or even not more than 1.5 mm. Also, even when the distance between the patterns is short as described above, compared to when a brazing material including silver is used, the occurrence of ion migration can be suppressed. This is because ion migration occurs more easily for silver than copper. Also, the size of the brazing material jutting portion that remains can be not less than 10 μm and not more than 200 μm, or even not less than 10 μm and not more than 100 μm. That is, the time of the brazing material etching process can be shortened while controlling the distance between the patterns and the size of the brazing material jutting portion. Also, the ceramic circuit board can be manufactured with a high yield even when the total area of the exposed brazing material per ceramic circuit board increases to be not less than 2000 $mm^2$.

Also, because the brazing material layer does not include Ag, even a large ceramic circuit board can be manufactured with a high yield. Multi-part manufacturing processes may be performed by subdividing the obtained ceramic circuit board as necessary. Also, the ceramic circuit board may be manufactured using a ceramic substrate in which scribing is performed beforehand.

Examples 1 to 5 and Comparative Example 1

Silicon nitride substrates (having a substrate thickness of 0.32 mm, a thermal conductivity of 90 W/m·K, and a three-point bending strength of 650 MPa) and aluminum nitride substrates (having a substrate thickness of 0.635 mm, a thermal conductivity of 180 W/m·K, and a three-point bending strength of 350 MPa) were prepared as ceramic substrates. The silicon nitride substrates are indicated by "$Si_3N_4$", and the aluminum nitrides are indicated by "AlN".

Also, three types of copper plates having thicknesses of 0.3 mm, mm, and 0.8 mm were prepared. The copper plate having a thickness of 0.3 mm is indicated by "copper plate 1", the copper plate having a thickness of 0.5 mm is indicated by "copper plate 2", and the copper plate having a thickness of mm is indicated by "copper plate 3".

The longitudinal and lateral sizes of the ceramic substrate are as shown in Table 1. Also, the longitudinal and lateral sizes of the copper plates respectively were equal to the longitudinal and lateral sizes of the ceramic substrates.

TABLE 1

| | Ceramic substrate | | Copper plate | |
| | Material | Length(mm) × Width(mm) | Front copper plate | Back copper plate |
|---|---|---|---|---|
| Example 1 | $Si_3N_4$ | 250 × 200 | Copper plate 2 | Copper plate 2 |
| Example 2 | $Si_3N_4$ | 300 × 250 | Copper plate 3 | Copper plate 3 |
| Example 3 | $Si_3N_4$ | 350 × 250 | Copper plate 3 | Copper plate 3 |
| Example 4 | AlN | 200 × 150 | Copper plate 1 | Copper plate 1 |
| Example 5 | AlN | 250 × 200 | Copper plate 2 | Copper plate 2 |
| Comparative example 1 | $Si_3N_4$ | 250 × 200 | Copper plate 3 | Copper plate 3 |

Then, bonded bodies were manufactured by performing a thermal bonding process using the active metal brazing materials shown in Table 2. Brazing materials not including Ag were used in the examples; and a brazing material including Ag was used in the comparative example.

TABLE 2

| | Brazing material layer | |
| | Brazing material component (mass %) | Brazing material layer thickness (μm) |
|---|---|---|
| Example 1 | Cu(71.8)—Sn(23)—TiH₂(5)—C(0.2) | 30 |
| Example 2 | Cu(66)—Sn(24)—TiH₂(10) | 40 |
| Example 3 | Cu(71.7)—Sn(20)—TiH₂(8)—C(0.3) | 15 |
| Example 4 | Cu(78)—Sn(18.5)—TiH₂(3)—C(0.5) | 30 |
| Example 5 | Cu(68)—Sn(21)—TiH₂(11) | 20 |
| Comparative example 1 | Ag(59)—Cu(25)—Sn(13)—TiH₂(3) | 30 |

After an etching resist was coated onto the copper plate of the front side, the copper plate was patterned into a patterned configuration by performing patterning by etching the bonded bodies of the examples and comparative example. A second iron chloride aqueous solution was used in the etching of the copper plate and the copper alloy layer. Each copper plate pattern included a location at which the distance between patterns was 1.5 mm and a location at which the distance between patterns was 2.0 mm. A bonded body in which the brazing material layer was exposed was made by patterning by etching the copper plate and the copper alloy layer. The total areas ($mm^2$) per bonded body are shown in Table 3 as the areas of the exposed brazing material layers.

TABLE 3

| | Total area of exposed brazing material layer ($mm^2$) |
|---|---|
| Example 1 | 2500 |
| Example 2 | 3000 |
| Example 3 | 4500 |
| Example 4 | 2000 |
| Example 5 | 2500 |
| Comparative example 1 | 2500 |

Then, the brazing material etchants shown in Table 4 and the chemical polishing liquids shown in Table 5 were prepared. For the brazing material etchants, the mass ratios are shown, where the total mass of hydrogen peroxide ($H_2O_2$), ammonium fluoride ($NH_4F$), and the pH-stabilizing agent was taken as 100 wt %. The aqueous solutions were mixed to have the mass ratios shown in Table 3. Fluoboric acid ($HBF_4$) was used as the pH-stabilizing agent. Also, the amount (L: liters) of purified water mixed with a total of 1 L of the hydrogen peroxide ($H_2O_2$)-including aqueous solution, the ammonium fluoride ($NH_4F$)-including aqueous solution, and the pH-stabilizing agent-including aqueous solution are shown. The pHs of the brazing material etchants also are shown.

Table 5 shows the chemical polishing liquids that were used and their content (wt %). Citric acid of Table 5 was one type of chelating agent, and was tricarboxylic acid.

TABLE 4

| | Brazing material etchant | | | | |
| | $H_2O_2$ (wt %) | $NH_4F$ (wt %) | $HBF_4$ (wt %) | Purified water (L) | pH |
|---|---|---|---|---|---|
| Brazing material etchant 1 | 30 | 34 | 36 | 1.0 | 5.3 |
| Brazing material etchant 2 | 25 | 40 | 35 | 0.8 | 5.6 |
| Brazing material etchant 3 | 35 | 35 | 30 | 1.7 | 5.0 |
| Brazing material etchant 4 | 65 | 20 | 15 | 1.2 | 4.9 |

TABLE 5

| | Chemical polishing liquid(wt %) | |
|---|---|---|
| Chemical polishing liquid 1 | $H_2O_2$(9 wt %) + Sulfuric acid(2 wt %) | Purified water |
| Chemical polishing liquid 2 | Hydrochloric acid(5 wt %) | Purified water |
| Chemical polishing liquid 3 | $Na_2S_2O_3$(20 wt %) + Citric acid(0.1 wt %) | Purified water |

The methods for manufacturing the ceramic circuit boards shown in Table 6 were performed by combining the bonded bodies according to the examples and comparative example, the brazing material etchants 1 to 4, and the chemical polishing liquids 1 to 3. In each example, the exposed brazing material layer was removed at a location between the patterned configurations of the copper plate. Also, cleaning processes with purified water were performed for 5 minutes after the brazing material etching process and after the chemical polishing process.

The brazing material etching processes performed while applying an "ultrasonic wave" are indicated by "xultrasonic wave". Also, the frequency of the ultrasonic wave was within the range of 10 to 100 kHz. Also, the etching processes were performed while heating the brazing material etchants to 30 to 60° C.

TABLE 6

| | Brazing material etching process (First time) | Chemical polishing process (First time) | Brazing material etching process (Second time) | Chemical polishing process (Second time) |
|---|---|---|---|---|
| Example 1 | Brazing material etchant 1 ×3 minutes ×Ultrasonic wave | Chemical polishing liquid 1 ×30 seconds | Brazing material etchant 1 ×3 minutes ×Ultrasonic wave | Chemical polishing liquid 1 ×1 minutes |
| Example 2 | Brazing material etchant 2 ×2 minutes | Chemical polishing liquid 2 ×1 minutes | — | — |
| Example 3 | Brazing material etchant 3 ×3 minutes ×Ultrasonic wave | Chemical polishing liquid 1 ×1 minutes | Brazing material etchant 3 ×2 minutes ×Ultrasonic wave | Chemical polishing liquid 1 ×3 minutes |
| Example 4 | Brazing material etchant 4 ×3 minutes ×Ultrasonic wave | Chemical polishing liquid 3 ×2 minutes | — | — |
| Example 5 | Brazing material etchant 2 ×4 minutes ×Ultrasonic wave | Chemical polishing liquid 1 ×2 minutes | — | — |
| Comparative example 1 | Brazing material etchant 1 ×5 minutes ×Ultrasonic wave | Chemical polishing liquid 1 ×1 minutes | Brazing material etchant 1 ×5 minutes ×Ultrasonic wave | Chemical polishing liquid 1 ×1 minutes |

Each brazing material etching process was performed on thirty bonded bodies at a time. The residual amount of the brazing material jutting portion was checked for the obtained bonded bodies. The ratio of the region in which the length of the brazing material jutting portion from the copper plate end portion between the patterned configurations of the copper plate was within the range of not less than 20 μm and not more than 60 μm was determined.

Figure 7:
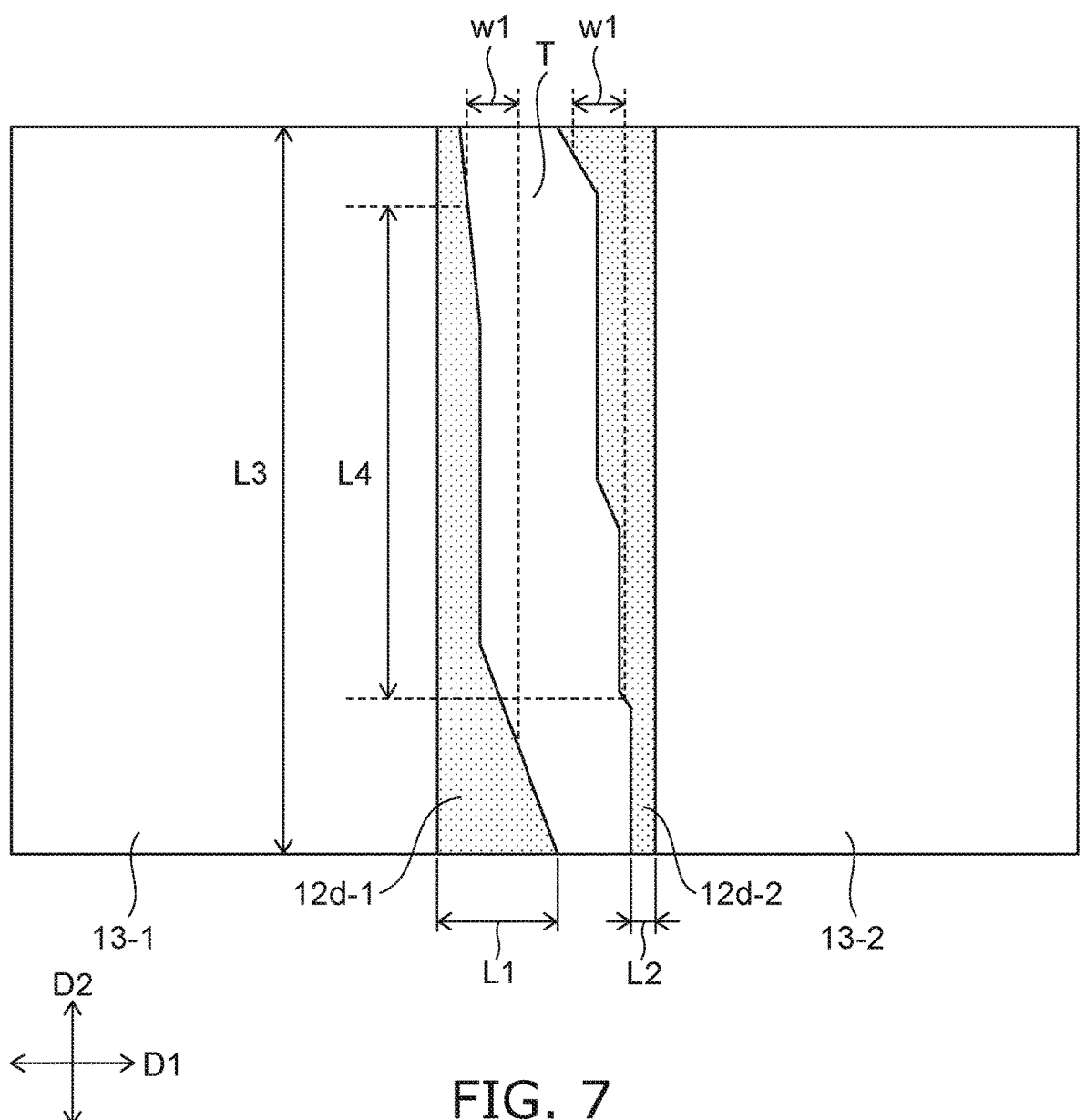
FIG. 7 is a plan view illustrating a portion of a ceramic circuit board.

FIG. 7 is a plan view illustrating a portion of the ceramic circuit board, and is a schematic view for describing the method for calculating the ratio of the region. FIG. 7 shows copper plates 13-1 and 13-2 that were divided by the copper etching process. A trench T was formed between the copper plate 13-1 and the copper plate 13-2. Brazing material jutting portions 12d-1 and 12d-2 were visible between the copper plate 13-1 and the copper plate 13-2 when viewed in plan. The length from the side surface of the copper plate 13-1 to the brazing material jutting portion 12d-1 tip in a first direction D1 connecting the patterned configurations to each other was measured as a length L1 of the brazing material jutting portion. Also, the length from the side surface of the copper plate 13-2 to the brazing material jutting portion 12d-2 tip in the first direction D1 was measured as a length L2 of the brazing material jutting portion. A length L3 between the patterned configurations in a second direction D2 along the trench T was measured. The second direction D2 was orthogonal to the first direction D1. The first direction D1 and the second direction D2 were parallel to the in-plane direction. The region in which both the lengths L1 and L2 respectively of the brazing material jutting portions 12d-1 and 12d-2 were within a range W1 that was not less than 20 μm and not more than 60 μm was designated. A length L4 in the second direction D2 of the designated region was measured. The ratio (L4/L3) in which both the lengths L1 and L2 were within the range W1 when the length L3 between the patterned configurations of the copper plate was taken as 100 was calculated. The surface roughness Ra (μm) of the copper plate also was measured. The results are shown in Table 7.

TABLE 7

| | Region ratio (%) | Copper plate surface roughness Ra(μm) |
|---|---|---|
| Example 1 | 100 | 0.6 |

TABLE 7-continued

| | Region ratio (%) | Copper plate surface roughness Ra(μm) |
|---|---|---|
| Example 2 | 94 | 0.5 |
| Example 3 | 100 | 0.4 |
| Example 4 | 99 | 0.4 |
| Example 5 | 98 | 0.7 |
| Comparative example 1 | 85 | 0.6 |

It can be seen from the tables that according to the method for manufacturing the ceramic circuit board according to the examples, the size of the brazing material jutting portion can be controlled. Therefore, even a large ceramic circuit board can be manufactured with a high yield. Also, in the comparative example 1, the yield decreased when the ceramic circuit board was large because the brazing material layer included Ag. According to the examples, the life of the etchant also was extended because the number of etching processes was reduced.

Examples 6 to 7

The brazing material etchants 5 and 6 shown in Table 8 were prepared. The concentration of the brazing material etchant 5 was about half of the concentration of the brazing material etchant 1. The concentration of the brazing material etchant 6 was about half of the concentration of the brazing material etchant 2.

TABLE 8

| | Brazing material etchant | | | | |
|---|---|---|---|---|---|
| | $H_2O_2$ (wt %) | $NH_4F$ (wt %) | $HBF_4$ (wt %) | Purified water (L) | pH |
| Brazing material etchant 5 | 15 | 18 | 16 | 1.0 | 5.2 |
| Brazing material etchant 6 | 10 | 22 | 18 | 0.8 | 5.4 |

The brazing material etching process was performed using conditions similar to those of the comparative example 1. An example in which the brazing material etchant 1 of the comparative example 1 was replaced with the brazing material etchant 5 was used as the example 6. An example in which the brazing material etchant 1 of the comparative example 1 was replaced with the brazing material etchant 6 was used as the example 7. The residual amount of the brazing material jutting portion and the surface roughness of the copper plate surface were checked similarly to the comparative example 1. The results are shown in Table 9.

TABLE 9

|  | Region ratio (%) | Copper plate surface roughness Ra(μm) |
|---|---|---|
| Example 6 | 94 | 0.6 |
| Example 7 | 90 | 0.6 |

It can be seen from Table 9 that good results were obtained for the examples compared to the comparative example even when the concentration of the brazing material etchant was lowered. It was found that by using a brazing material that does not include Ag, good results are obtained even when the concentration of the brazing material etchant is lowered. It was found that in this respect as well, the life of the brazing material etchant can be extended.

Also, various residue amounts were checked to check the effects of the finishing cleaning process. The measurement method was performed using a method using XPS described below.

The cleaning method, flow rate, and drying process of each example are shown in Table 10. "None" shown in the table indicates that the process was not performed. Also, in the cleaning process, "IPA" indicates that the cleaning was performed using isopropanol. "Alkaline" indicates that cleaning was performed using an alkaline solution having a pH of not less than 10. Also, the numerals of the flow rate (L/minute/cm$^2$) shown in the cleaning method indicate that a nozzle was used. The label "immersion" indicates that the bonded body was immersed in a cleaning tank. "None" indicates that a cleaning process was not performed.

The drying process will now be described. In the drying process, natural drying is a method in which the bonded body was left idle without particularly removing the water droplets adhered to the surfaces, etc. Oblique is a method in which the adhesion amount of the water droplets was reduced by positioning the bonded body obliquely. "Acetone" indicates that acetone was used. "Air blowing" indicates that air blowing was used.

hydrogen peroxide decreased 10 to 20 wt % from the initial concentration. In Table 11, a white circle indicates that the nitrogen, oxygen, or carbon was not more than 30 atomic %, where the amount of nitrogen, oxygen, carbon, and copper of the copper member surface was taken as 100 atomic %. "x" indicates that the nitrogen, oxygen, or carbon was greater than 30 atomic %. XPS analysis was used to measure the atomic weight at the surface. An SSI Corporation X-probe was used as the XPS analysis device. In the XPS analysis, Al K$_\alpha$-rays (hv=1486.6 eV) were used, and the spot diameter of the X-rays was set to a diameter of 1 mm. Also, the durability was the durability of the etchant. The number of uses until the etching rate decreased 20% is shown as the durability.

TABLE 11

|  | Copper plate surface | | | Durability of each liquid | |
|---|---|---|---|---|---|
|  | Carbon amount (at %) | Oxygen amount (at %) | Nitrogen amount (at %) | Brazing material etchant | Chemical polishing liquid |
| Example 1 | ○ | ○ | ○ | 8 | 6 |
| Example 2 | ○ | ○ | ○ | 10 | 10 |
| Example 3 | ○ | ○ | ○ | 5 | 7 |
| Example 4 | ○ | ○ | ○ | 7 | 4 |
| Example 5 | ○ | ○ | ○ | 3 | 3 |
| Example 6 | ○ | ○ | ○ | 6 | 5 |
| Example 7 | ○ | X | X | 5 | 6 |
| Comparative example 1 | X | X | X | 2 | 2 |

It can be seen from Tables 10 and 11 that there is a correlation between the finishing cleaning method and the residue amount, and that the residue can be reduced by the cleaning methods other than immersion.

Accordingly, by performing the finishing cleaning process, it is possible to provide a substrate having little residue. Accordingly, for example, this indicates that it is possible to provide an easy-to-use substrate having few unfavorable effects due to various residue when mounting a semiconductor element, etc. Also, from Table 10, it was found that the replacement frequency of the etchant of the next process can be further reduced by including a cleaning process or a drying process between the processes for each etching process or chemical polishing process.

| | Flow rate of cleaning process after resist removal (L/min/cm$^2$) | | | Method of drying process after each etching or chemical polishing process | | |
|---|---|---|---|---|---|---|
| | After copper plate etching process | After brazing material etching process | During finishing cleaning process | After copper plate etching process | After brazing material etching process | During finishing cleaning process |
| Example 1 | 0.1 | None | 0.01 | Natural drying | None | Air blowing |
| Example 2 | 0.01 | IPA | 0.08 | Oblique | Air blowing | Air blowing |
| Example 3 | 0.02 | Immersion | 0.1 | Acetone | Natural drying | Air blowing |
| Example 4 | Immersion | Immersion | Alkaline | Air blowing | None | Natural drying |
| Example 5 | None | None | 0.03 | None | None | Air blowing |
| Example 6 | 0.04 | 0.05 | 0.05 | Air blowing | Oblique | Air blowing |
| Example 7 | Immersion | Immersion | Immersion | Air blowing | Natural drying | Air blowing |
| Comparative example 1 | None | None | Immersion | None | None | Natural drying |

The correlation between the cleaning methods shown in Table 10 and the residue and the correlation between the cleaning methods and the durability of each solution were checked. The results are shown in Table 11. The replacement of the etchant was performed when the concentration of While certain embodiments of the inventions have been illustrated, these embodiments have been presented by way of example only, and are not intended to limit the scope of the inventions. These novel embodiments may be embodied in a variety of other forms; and various omissions, substitutions, modifications, etc., can be made without departing from the spirit of the inventions. These embodiments and their modifications are within the scope and spirit of the inventions and are within the scope of the inventions described in the claims and their equivalents. Also, the embodiments described above can be implemented in combination with each other.

What is claimed is:

1. A method for manufacturing a ceramic circuit board, the method comprising:

a process of preparing a bonded body in which a copper member is bonded to at least one surface of a ceramic substrate via a brazing material layer, the brazing material layer not including Ag, the brazing material layer including Cu, an active metal, and a first element, the first element being at least one selected from Sn and In;

a first copper etching process of etching a portion of the copper member and a layer included in the brazing material layer by using at least one of iron chloride or copper chloride in the first copper etching process to expose a part of an active metal reaction layer included in the brazing material layer, the layer included in the brazing material layer including Cu and the first element as major components;

a first brazing material etching process of etching the exposed part of the active metal reaction layer by using an etchant including one or two selected from hydrogen peroxide and ammonium peroxodisulfate, the etchant having a pH of not less than 4 and not more than 6, a jutting portion of the brazing material layer that juts from the copper member being formed, the jutting portion including a precipitate that includes Cu; and a first chemical polishing process of chemically polishing the jutting portion, a chemical polishing liquid including sulfuric acid or hydrochloric acid being used to remove the precipitate, wherein a length of the jutting portion after the first chemical polishing process is not less than 10 μm and not more than 200 μm.

2. The method for manufacturing the ceramic circuit board according to claim 1, wherein a length of a long side of the ceramic substrate is not less than 100 mm.

3. The method for manufacturing the ceramic circuit board according to claim 1, wherein a length of a long side of the ceramic substrate is not less than 200 mm.

4. The method for manufacturing the ceramic circuit board according to claim 1, wherein there is a location at which a distance between the etched copper members is not more than 2 mm.

5. The method for manufacturing the ceramic circuit board according to claim 1, wherein the etchant further includes ammonium fluoride and a pH-stabilizing agent.

6. The method for manufacturing the ceramic circuit board according to claim 5, wherein the pH-stabilizing agent is at least one selected from $HBF_4$, EDTA, NTA, CyDTA, DTPA, TTHA, GEDTA, glycine, dicarboxylic acid, tricarboxylic acid, oxycarboxylic acid, and their salts.

7. The method for manufacturing the ceramic circuit board according to claim 1, further comprising:

a cleaning process of cleaning the bonded body after the first brazing material etching process and the first chemical polishing process.

8. The method for manufacturing the ceramic circuit board according to claim 1, wherein the ceramic substrate is a nitride ceramic substrate.

9. The method for manufacturing the ceramic circuit board according to claim 1, wherein the first copper etching process includes coating an etching resist on the copper member, and subsequently patterning the copper member into a patterned configuration by etching the portion of the copper member.

10. The method for manufacturing the ceramic circuit board according to claim 9, wherein the first brazing material etching process is performed on the bonded body from which the etching resist is removed after the copper member is etched.

11. The method for manufacturing the ceramic circuit board according to claim 1, wherein the first brazing material etching process is performed while applying an ultrasonic wave to the bonded body.

12. The method for manufacturing the ceramic circuit board according to claim 1, wherein a second copper etching process of etching the copper member is performed after the first chemical polishing process.

13. The method for manufacturing the ceramic circuit board according to claim 1, wherein a cleaning process in which a flow rate of a cleaning water is not less than 1.3 L (liter)/minute is performed as a finishing cleaning process.

14. The method for manufacturing the ceramic circuit board according to claim 13, wherein a drying process after the finishing cleaning process is performed using air within a range of not less than 20 m/s and not more than 150 m/s and with a humidity of not more than 70%.

15. The method for manufacturing the ceramic circuit board according to claim 1, further comprising:

a cleaning process of cleaning the bonded body after the first brazing material etching process and the first chemical polishing process.

16. The method for manufacturing the ceramic circuit board according to claim 15, wherein a cleaning process in which a flow rate of a cleaning water is not less than 1.3 L (liter)/minute is performed as a finishing cleaning process.

17. The method for manufacturing the ceramic circuit board according to claim 16, wherein a drying process after the finishing cleaning process is performed using air within a range of not less than 20 m/s and not more than 150 m/s and with a humidity of not more than 70%.

18. The method for manufacturing the ceramic circuit board according to claim 1, wherein a cleaning process of cleaning the bonded body by spraying water from a nozzle is performed as a finishing cleaning process, and in the cleaning process, a distance between the nozzle and the bonded body is set within a range not less than 5 cm and not more than 40 cm.

19. The method for manufacturing the ceramic circuit board according to claim 1, wherein a cleaning process of cleaning the bonded body by spraying water from a nozzle is performed as a finishing cleaning process, and in the cleaning process, a water amount that impacts the bonded body per nozzle is within a range of not less than 0.01 L/(minute·cm$^2$) and not more than 0.1 L/(minute·cm$^2$).

* * * * *